(12) United States Patent
Kwon et al.

(10) Patent No.: US 8,415,189 B2
(45) Date of Patent: Apr. 9, 2013

(54) METHODS OF FABRICATING IMAGE SENSORS INCLUDING IMPURITY LAYER ISOLATION REGIONS

(75) Inventors: Doowon Kwon, Seongnam-si (KR); Seung-Hun Shin, Yongin-Si (KR)

(73) Assignee: Samsung Electronics Co., Ltd. (KR)

( * ) Notice: Subject to any disclaimer, the term of this patent is extended or adjusted under 35 U.S.C. 154(b) by 770 days.

(21) Appl. No.: 12/512,779

(22) Filed: Jul. 30, 2009

(65) Prior Publication Data

US 2010/0015747 A1    Jan. 21, 2010

Related U.S. Application Data

(62) Division of application No. 11/668,016, filed on Jan. 29, 2007, now Pat. No. 7,586,170.

(30) Foreign Application Priority Data

Aug. 10, 2006  (KR) ........................ 10-2006-0075705

(51) Int. Cl.
*H01L 21/00* (2006.01)

(52) U.S. Cl.
USPC .............................................. 438/48; 438/73

(58) Field of Classification Search ............ 438/48, 438/66, 67, 73, 79, 80, 98, 570, 982; 257/E27.132, 257/E27.133
See application file for complete search history.

(56) References Cited

U.S. PATENT DOCUMENTS

| 6,818,930 | B2 | 11/2004 | Mouli et al. |
| 6,888,214 | B2 | 5/2005 | Mouli et al. |
| 7,064,406 | B2 | 6/2006 | Mouli |
| 7,544,560 | B2 * | 6/2009 | Noh .............................. 438/221 |
| 2006/0138470 | A1 | 6/2006 | Han |
| 2007/0141801 | A1 | 6/2007 | Kwon et al. |

FOREIGN PATENT DOCUMENTS

| JP | 2005-217085 A | 8/2005 |
| KR | 2003-0056071 A | 7/2003 |
| KR | 2003-0056324 A | 7/2003 |
| KR | 10-2004-0058754 A | 7/2004 |
| KR | 10-0461973 B1 | 12/2004 |
| KR | 10-2006-0075767 A | 7/2006 |

* cited by examiner

*Primary Examiner* — Hung Vu
(74) *Attorney, Agent, or Firm* — Myers Bigel Sibley & Sajovec, P.A.

(57) ABSTRACT

Image sensors include a pixel region and a logic region. Pixel isolation regions in the pixel region include pixel isolation region walls that are less sloped than logic isolation region walls in the logic region. An impurity layer also may be provided adjacent at least some of the pixel isolation region walls, wherein at least some of the logic isolation region walls are free of the impurity layer. The impurity layer and/or the less sloped logic isolation region walls may also be provided for NMOS devices in the logic region but not for PMOS devices in the logic region. Doped sacrificial layers may be used to fabricate the impurity layer.

21 Claims, 22 Drawing Sheets

METHODS OF FABRICATING IMAGE SENSORS INCLUDING IMPURITY LAYER ISOLATION REGIONS

CROSS REFERENCE TO RELATED APPLICATIONS

This application is a divisional of U.S. patent application Ser. No. 11/668,016, filed Jan. 29, 2007 now U.S. Pat. No. 7,586,170, entitled Image Sensors Including Impurity Layer Adjacent Isolation Region, and claims the benefit under 35 USC §119 of Korean Patent Application No. 10-2006-0075705, filed on Aug. 10, 2006, the disclosures of both of which are hereby incorporated herein by reference in their entirety as if set forth fully herein.

FIELD OF THE INVENTION

This invention relates to integrated circuit devices and related fabrication methods, and more particularly to image sensor integrated circuit devices and fabrication methods therefor.

BACKGROUND OF THE INVENTION

Integrated circuit image sensors are widely used for capturing images in a variety of applications, such as digital cameras, camcorders, printers, scanners, etc. Integrated circuit image sensors generally include a plurality of photoelectric conversion elements that capture optical information and convert the optical information into electrical signals. A plurality of logic circuits is also included, which can be used to control the photoelectric conversion elements and to process the electrical signals that are produced by the photoelectric conversion elements.

The photoelectric conversion elements may be included in a pixel region in an image sensor integrated circuit substrate. A given photoelectric conversion pixel may include a single photodiode and four read transistors, commonly referred to as a transfer transistor, a reset transistor, a select transistor and a driver transistor. The logic circuits may be included in a logic region of the image sensor integrated circuit substrate. The logic region may include a timing generator, row/column decoders, a row driver, a correlated double sampler, an analog-to-digital converter, latches and/or other logic circuits.

There are two types of image sensor technologies that are presently widely used: a Charge Coupled Device (CCD) and a CMOS Image Sensor (CIS). CMOS Image Sensors may be increasingly used due to their potential for relatively high speed operation at relatively low power.

FIG. 1 is a block diagram of a conventional CMOS image sensor and its operating environment. Referring to FIG. 1, the CMOS image sensor includes a CMOS image sensor integrated circuit substrate 110. An Active Pixel Sensor (APS) array 112 is included in the integrated circuit substrate 110. The APS array 112 includes a two-dimensional array of photoelectric conversion elements, such as photodiodes, that are configured to capture optical information concerning an object 140 that may be provided via an optical system, such as a lens 142. A timing generator 128 generates timing signals for reading the APS array 112, A row driver 114 selects a pixel. A Corrected Double Sampling (CDS) unit 116 provides corrected double sampling of the output signal of a selected pixel. A comparator 118 compares the CDS output with a reference signal, and an Analog-To-Digital Converter (ADC) 122 converts the analog signal from the comparator 118 to a digital signal. A control register 132 controls the timing generator 128, a ramp generator 126 that drives the comparator 118 and a buffer 124 that stores the output of the ADC 122 to produce image data.

Still continuing with the description of FIG. 1, a digital signal processor (DSP) 150 may include an external interface 152, a camera control 154 and an image signal processor 156. The DSP 150 drives an external display 158. It will be understood that the DSP 150 may be embodied as a separate integrated circuit substrate or may be at least partially integrated with the image sensor integrated circuit substrate 110.

The design and operation of a CMOS image sensor, as illustrated in FIG. 1, are well known to those having skill in the art and need not be described further herein. Moreover, it will be understood that an image sensor need not include every block described in FIG. 1, that the functionality of a given block of FIG. 1 may be separated into two or more blocks, and that the functionality of two or more blocks of FIG. 1 may be merged.

As noted above, the image sensor integrated circuit substrate 110 may be divided into a pixel region that may include the APS array 112 and associated transfer, select, driver and reset transistors that may be used to access the photoelectric conversion elements in the APS array 112. Moreover, the logic region may include the timing generator 128, the row driver 114, the corrected double sampler 116, the comparator 118, the analog-to-digital converter 122, the buffer 124 and other circuits, such as row/column decoders, not shown in FIG. 1. As is also well known to those having skill in the art, the CMOS devices in the pixel region and the logic region may include P-channel devices, commonly referred to as PMOS devices, and N-channel devices, commonly referred to as NMOS devices. Moreover, an isolation layer also may be provided in the image sensor integrated circuit substrate, to define the active regions and to isolate the various devices from one another.

As is also well known to those having skill in the art, image sensors may suffer from a phenomenon known as "dark current". Dark current refers to electric charge that accumulates in the image sensor photodiodes in the absence of light. Dark current may manifest itself as an erroneous white pixel in the image. As is also well known to those having skill in the art, dark current may be caused by silicon dangling bonds, plasma damage, stress, implant damage, wafer defects, undesired electric fields and/or many other phenomena that may arise in the fabrication of an image sensor. These phenomena may generate some charge in the photodiodes, even in the absence of incident light.

It is also known that some dark current may result from the Shallow Trench Isolation (STI) methods and structures that are used in the image sensor. STI methods/structures may be used to form isolation regions that define the active regions and isolate the various devices from one another. In particular, it is known that the STI trench walls may have damage that is caused by anisotropic etching or dry etching processes that are used in fabricating the trenches. Etching damage, such as dangling bonds and/or stacking faults, may contribute to dark current.

One technique for reducing dark current in CMOS image sensors is described in U.S. Pat. No. 6,888,214 to Mouli et al., entitled Isolation Techniques for Reducing Dark Current in CMOS Image Sensors. As stated in the Abstract of this patent, this patent provides isolation methods and devices for isolating regions of a semiconductor device. The isolation method and structure include forming an isolating trench in an active area and filling the trench with a doped conductive material containing silicon. Suitable conductive materials containing silicon include polysilicon and silicon-germanium. There is also provided a method and structure for isolating the regions by providing a trench in an active area of a substrate, growing an epitaxial layer in the trench to fill the trench or to partially fill the trench and depositing an insulating material over the epitaxial layer and within the trench to completely fill the trench.

Another isolation technique for a CMOS image sensor is described in Korean Patent Publication No. 10-2004-0065335, published Jul. 22, 2004, entitled Method for Manufacturing CMOS Image Sensor. As stated in the extended English Abstract of this published Korean application, a method for manufacturing a CMOS image sensor is provided to reduce cross talk and leakage current by forming a channel stop ion-implanted region using a self-aligned mask. A buffer oxide layer, a pad nitride layer, and an Anti-Reflective Coating (ARC) layer are stacked on a substrate. The first photoresist pattern with the first opening part is formed on the resultant structure. The stacked structure is etched to expose the substrate. A trench is formed by selectively etching the exposed substrate. The second photoresist pattern with the second opening part is formed on the first photoresist pattern, wherein the second opening part is wider than that of the first opening part. A channel stop ion-implanted region is then formed in the substrate.

SUMMARY OF THE INVENTION

Image sensors according to some embodiments of the present invention comprise an image sensor integrated circuit substrate that includes a pixel region and a logic region. A plurality of photoelectric conversion elements is provided in the pixel region and a plurality of logic circuits is provided in the logic region. A plurality of logic isolation regions (for example, shallow trench isolation regions) is provided in the logic region. The logic isolation regions include logic isolation region walls. A plurality of pixel isolation regions (for example, shallow trench isolation regions) is provided in the pixel region. The pixel isolation regions include pixel isolation region walls that are less sloped than the logic isolation region walls. As used herein, "slope" is measured relative to a face of the image sensor integrated circuit substrate, so that a wall that is orthogonal to the face (commonly referred to as vertical) has more slope than a wall that is oblique.

In some embodiments, the logic isolation region walls are sloped at between about 83° and about 90° from a face of the substrate, and the pixel isolation region walls are sloped at between about 70° and about 80° from the face of the substrate. In other embodiments, the logic isolation region walls are substantially orthogonal to the face of the substrate, and the pixel isolation region walls are oblique to the face of the substrate.

Other embodiments of the present invention include an impurity layer in the substrate adjacent at least some of the pixel isolation region walls, wherein at least some of the logic isolation region walls are free of the impurity layer. In some embodiments, the impurity layer is between about 20 nm and about 50 nm thick.

Moreover, in some embodiments of the invention, the logic circuits include NMOS devices and PMOS devices, and the impurity layer is adjacent at least some of the logic isolation region walls that are adjacent the NMOS devices, whereas at least some of the logic isolation region walls that are adjacent the PMOS devices are free of the impurity layer. In other embodiments, the plurality of pixel isolation regions in the pixel region includes pixel isolation region walls that are less sloped than the logic isolation region walls that are adjacent the PMOS devices and that are of about the same slope as the logic isolation region walls that are adjacent the NMOS devices.

In some embodiments, the impurity layer comprises P-type dopant, such as boron. In other embodiments, the impurity layer is spaced apart from the photoelectric conversion elements. In still other embodiments, the photoelectric conversion elements comprise a first region of first conductivity type, and a second region of second conductivity type beneath the first region, and the impurity layer is spaced apart from the second region.

Other embodiments of the present invention provide the above-described impurity layers separate and apart from the multiple slope isolation region walls. Specifically, in some embodiments of the present invention, an image sensor comprises an image sensor integrated circuit substrate including a pixel region and a logic region. A plurality of photoelectric conversion elements is provided in the pixel region. A plurality of logic circuits is provided in the logic region, and includes NMOS devices and PMOS devices. A plurality of logic isolation regions is included in the logic region. The logic isolation regions include logic isolation region walls. A plurality of pixel isolation regions is provided in the pixel region. The pixel isolation regions include pixel isolation trench walls. An impurity layer is also included in the substrate. The impurity layer is adjacent at least some of the logic isolation region walls that are adjacent the NMOS devices and at least some of the pixel isolation region walls, wherein at least some of the logic isolation region walls that are adjacent the PMOS devices are free of the impurity layer. The impurity layer may be configured according to any of the embodiments that were described above.

Integrated circuits may be fabricated, according to some embodiments of the present invention, by etching a plurality of spaced apart isolation trenches in an integrated circuit substrate, the trenches including trench walls. A sacrificial layer, including an impurity therein, is formed on at least some of the trench walls. At least some of the impurity is diffused from the sacrificial layer into the trench walls to form an impurity layer in the substrate adjacent the trench walls. In some embodiments, the diffusion may take place by rapid thermal annealing. At least some of the sacrificial layer is then removed. In still other embodiments, after the sacrificial layer has been at least partially removed, an insulating layer may be formed in the trenches. In other embodiments, the trenches may be filled with insulating material, to form isolation regions. In some embodiments, a plurality of photoelectric conversion elements is also formed in the substrate, such that the photoelectric elements are adjacent the impurity layer, and the impurity layer reduces dark current in the photoelectric conversion elements compared to absence of the impurity layer.

Various embodiments of the sacrificial layer may be provided according to various embodiments of the present invention. For example, in some embodiments, the sacrificial layer comprises a sacrificial layer liner. In other embodiments, forming the sacrificial layer liner is followed by forming a sacrificial trench filling layer on the sacrificial layer liner. In some embodiments, the sacrificial layer liner comprises monocrystalline silicon germanium and/or polycrystalline silicon germanium that is doped with the impurities. In other embodiments, the sacrificial layer liner comprises monocrystalline silicon germanium that is doped with the impurity, and the sacrificial trench filling layer comprises polycrystalline silicon germanium that is doped with the impurity. In still other embodiments, the sacrificial layer comprises monocrystalline silicon germanium and/or polycrystalline silicon germanium that is doped with the impurity.

According to still other embodiments of the present invention, when removing at least some of the sacrificial layer, the sacrificial layer and at least some of the trench walls can be etched to decrease a slope of the trench walls. For example, the trench walls may be substantially orthogonal to the face of the substrate prior to etching, and may be oblique to the face of the substrate after the etching. In other embodiments, the trench walls may be sloped at between about 83° and about 90° from a face of the substrate prior to the etching, and may be sloped at between about 70° and about 80° from the face of the substrate after the etching.

Moreover, in some embodiments, the sacrificial layer may be selectively formed on some of the trench walls, such that others of the trench walls are free of the sacrificial layer thereon. In particular, in some embodiments, the sacrificial layer may be selectively formed on at least some of the trench walls in the pixel region, such that at least some of the trench walls in the logic region are free of the sacrificial layer thereon. In still other embodiments, the sacrificial layer may be selectively formed on at least some of the trench walls in the pixel region, and at least some of the trench walls in the NMOS device region, such that at least some of the trench walls in the PMOS region are free of the sacrificial layer thereon.

DETAILED DESCRIPTION

Figure 1:
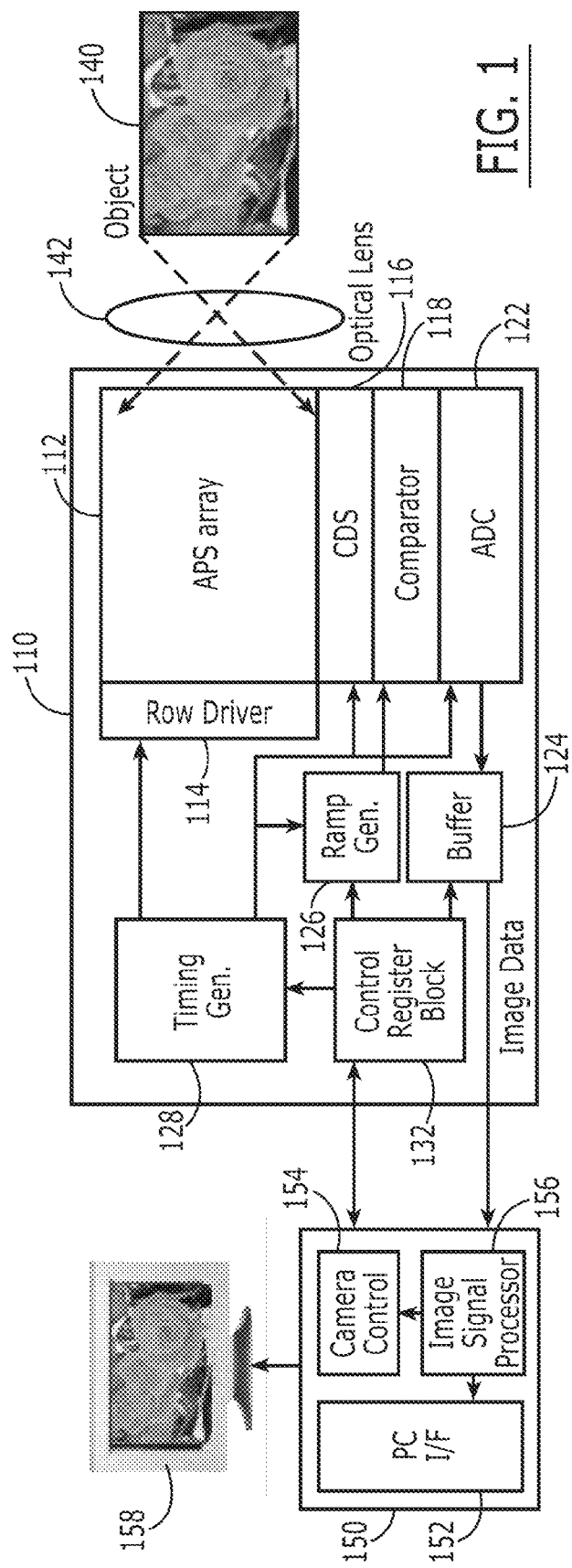
FIG. 1 is a block diagram of a conventional CMOS image sensor.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly. Moreover, the term "beneath" indicates a relationship of one layer or region to another layer or region relative to the substrate, as illustrated in the figures.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to plan and cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "slope" of a trench wall is defined relative to the faces of the image sensor integrated circuit substrate, shown as horizontal in the cross-sectional views. Accordingly, a larger slope or more sloped means approaching orthogonal to the faces of the substrate, whereas a smaller slope is more oblique relative to the major face of the substrate. Stated differently, a first trench wall is less sloped than a second trench wall when the first trench wall makes a smaller acute angle with the substrate face (horizontal in the drawings) than the second trench wall.

Figure 2A:
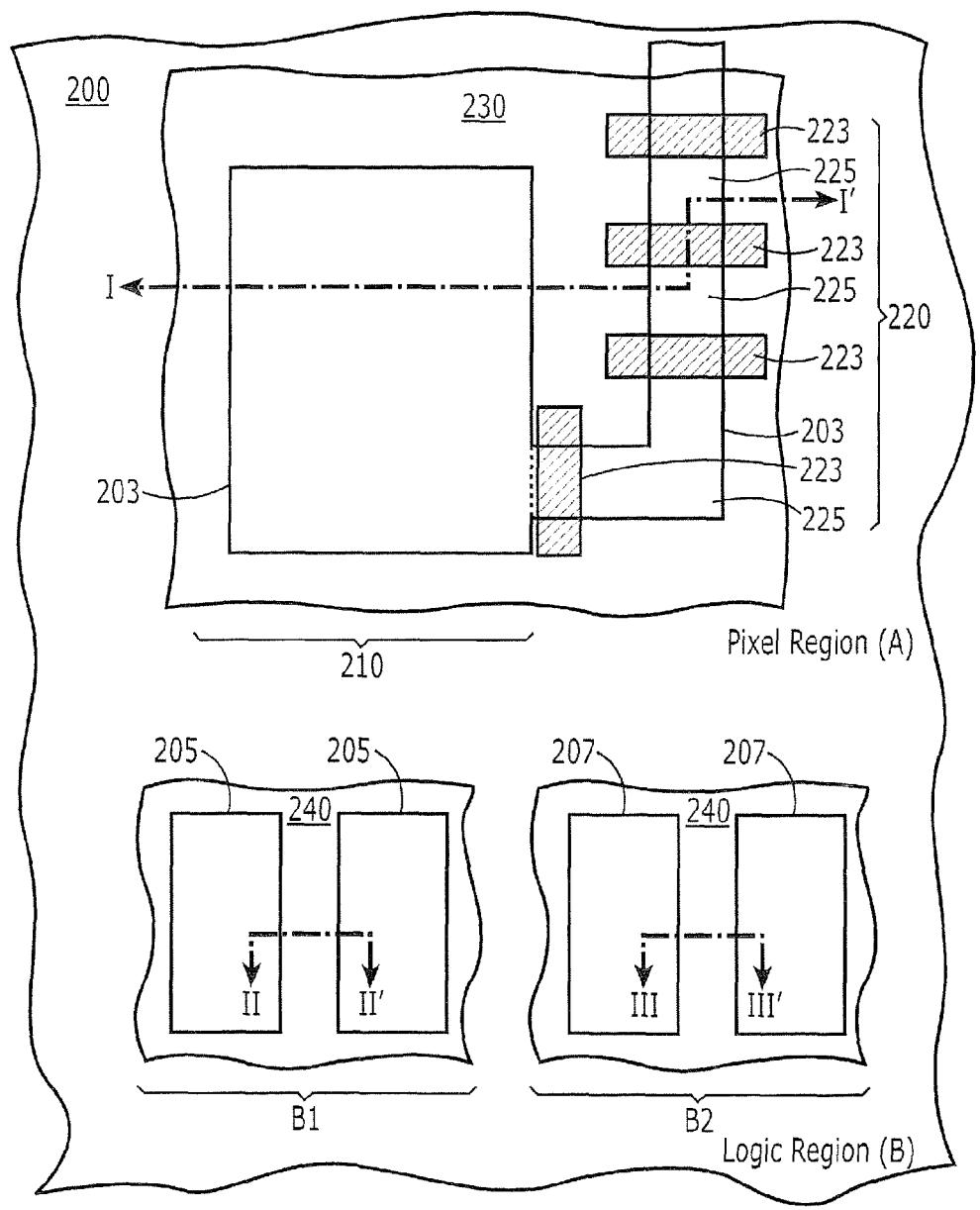
FIG. 2A is a top view of an image sensor according to various embodiments of the present invention.
Figure 2B:
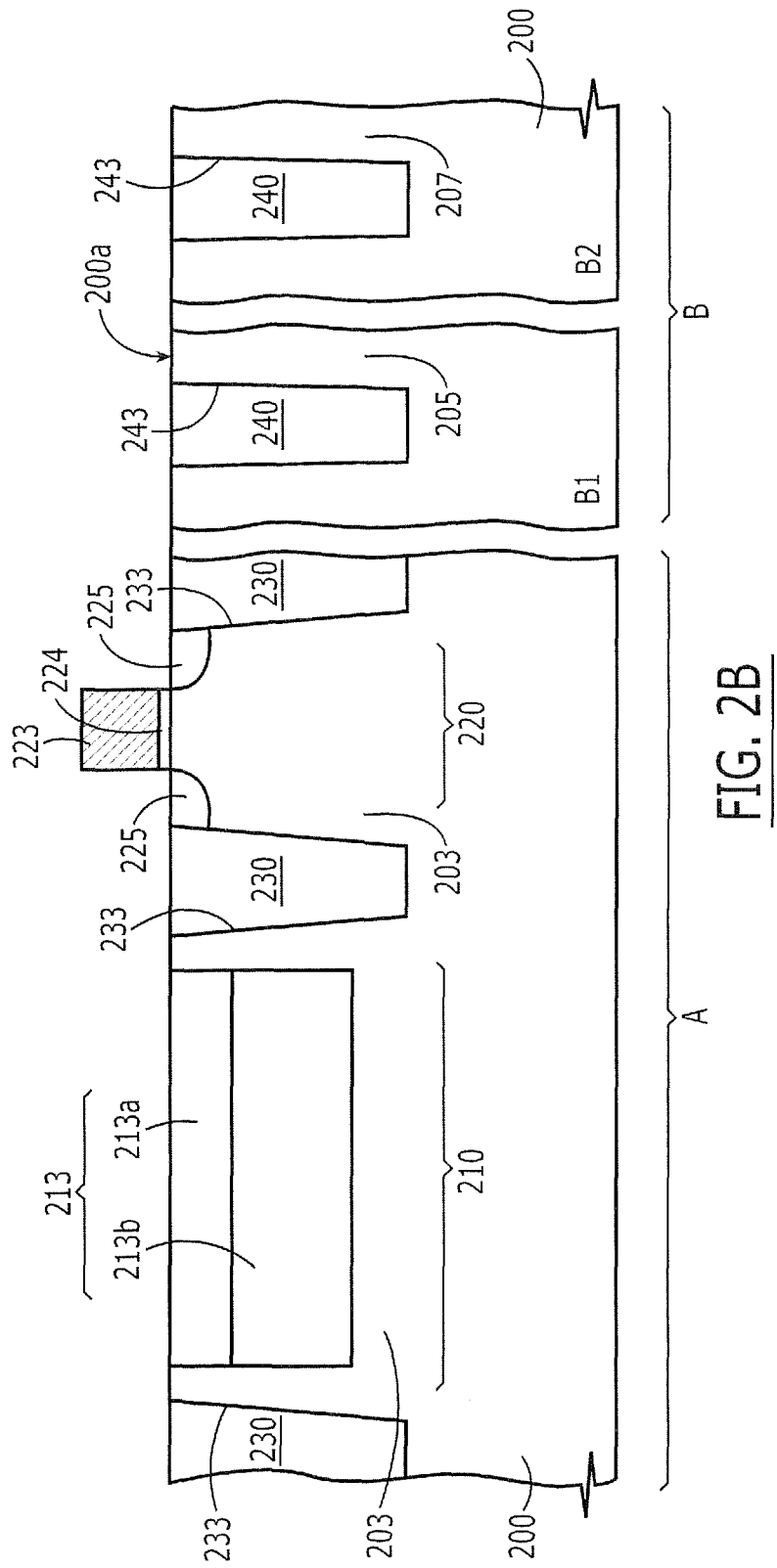
FIG. 2B is a cross-sectional view taken along the lines I-I', II-II' and III-III' of FIG. 2A.

FIG. 2A is a top view of an image sensor according to various embodiments of the present invention, and FIG. 2B is a cross-sectional view taken along the lines I-I', II-II' and III-III' of FIG. 2A.

Referring now to FIGS. 2A and 2B, image sensors according to these embodiments of the invention include an image sensor integrated circuit substrate 200 that includes a pixel region A and a logic region B. The integrated circuit substrate 200 may be a single element and/or compound semiconductor substrate, such as a monocrystalline silicon substrate, and may include one or more epitaxial and/or other layers thereon. The integrated circuit substrate 200 may also include a thin semiconductor layer on a semiconductor or non-semiconductor substrate, also commonly referred to as Semiconductor-on-Insulator (SOI) technology.

Still referring to FIGS. 2A and 2B, a plurality of photoelectric conversion elements 210 is included in the pixel region A. Only a single photoelectric conversion element 210 is shown in the figures, for convenience. The photoelectric conversion element 210 may include a first region 213a of first conductivity type, for example P-type, and a second region 213b of second conductivity type, for example N-type, beneath the first region 213a. The integrated circuit substrate 200 may be a P-type substrate or may include a P-well, so that the region beneath the second region of second conductivity type 213b may also be P-type. The photoelectric conversion element 210 may, thereby, include a first P-N junction formed by regions 213a and 213b, and a second P-N junction formed by regions 213b and the substrate 200. A plurality of read-out elements (e.g., transistors) 220 also may be connected to the photoelectric conversion element 210. For example, an isolation region 230 may define an active region 203, a drain region 225 and a plurality of gates 223. The gates 223, which may include a transfer gate, a select gate, a driver gate and a reset gate, can define a plurality of readout transistors that is associated with the photoelectric conversion element 210. A gate isolation layer 224 also may be provided beneath a respective gate 223. The design of a pixel region as described in this paragraph is well known to those having skill in the art and need not be described further herein.

The logic region B may include a timing generator, a row decoder, a row driver, a correlated double sampler, an analog-to-digital converter, a latch block, a row decoder, a column decoder and/or other logic elements. As shown in FIGS. 2A and 2B, the logic region B may include an NMOS region B1 and a PMOS region B2. The NMOS region B1 may include an NMOS active region 205 that is defined by a logic isolation region 240. The PMOS region B2 may include a PMOS active region 207 that is defined by the logic isolation region 240. The design and operation of logic region B as described in this paragraph is well known to those having skill in the art and need not be described further herein.

As noted above, a plurality of logic isolation regions 240 is provided in the logic region B. The logic isolation regions 240 include logic isolation region walls 243. A plurality of pixel isolation regions 230 also is included in the pixel region A, and these pixel isolation regions 230 include pixel isolation region walls 233. As shown in FIG. 2B, the pixel isolation region walls 233 are less sloped than the logic isolation region walls 243. In particular, in some embodiments, the logic isolation region walls 243 are substantially orthogonal to the face 200a of the substrate 200, whereas the pixel isolation region walls 233 are oblique to the face 200a of the substrate 200. In other embodiments, the logic isolation region walls 243 are sloped at between about 83° and about 90° from the face 200a of the substrate 200, and the pixel isolation region walls 233 are sloped at between about 70° and about 80° from the face 200a of the substrate 200. In still other embodiments, the logic isolation region walls 243 are sloped at about 88° and the pixel isolation region walls 233 are sloped at about 80°. Stated another way, referring to FIG. 2B, the portions of the pixel isolation trenches 230 that are adjacent the face 200a, are substantially wider than the portions thereof that are remote from the face 200a. In contrast, the logic isolation regions 240 may have similar width adjacent the face 200a and remote from the face 200a. By providing less slope in the pixel isolation trench walls, the pixel isolation regions 230 may be sufficiently removed from the second photodiode region 213b, to reduce dark current.

Figure 3A:
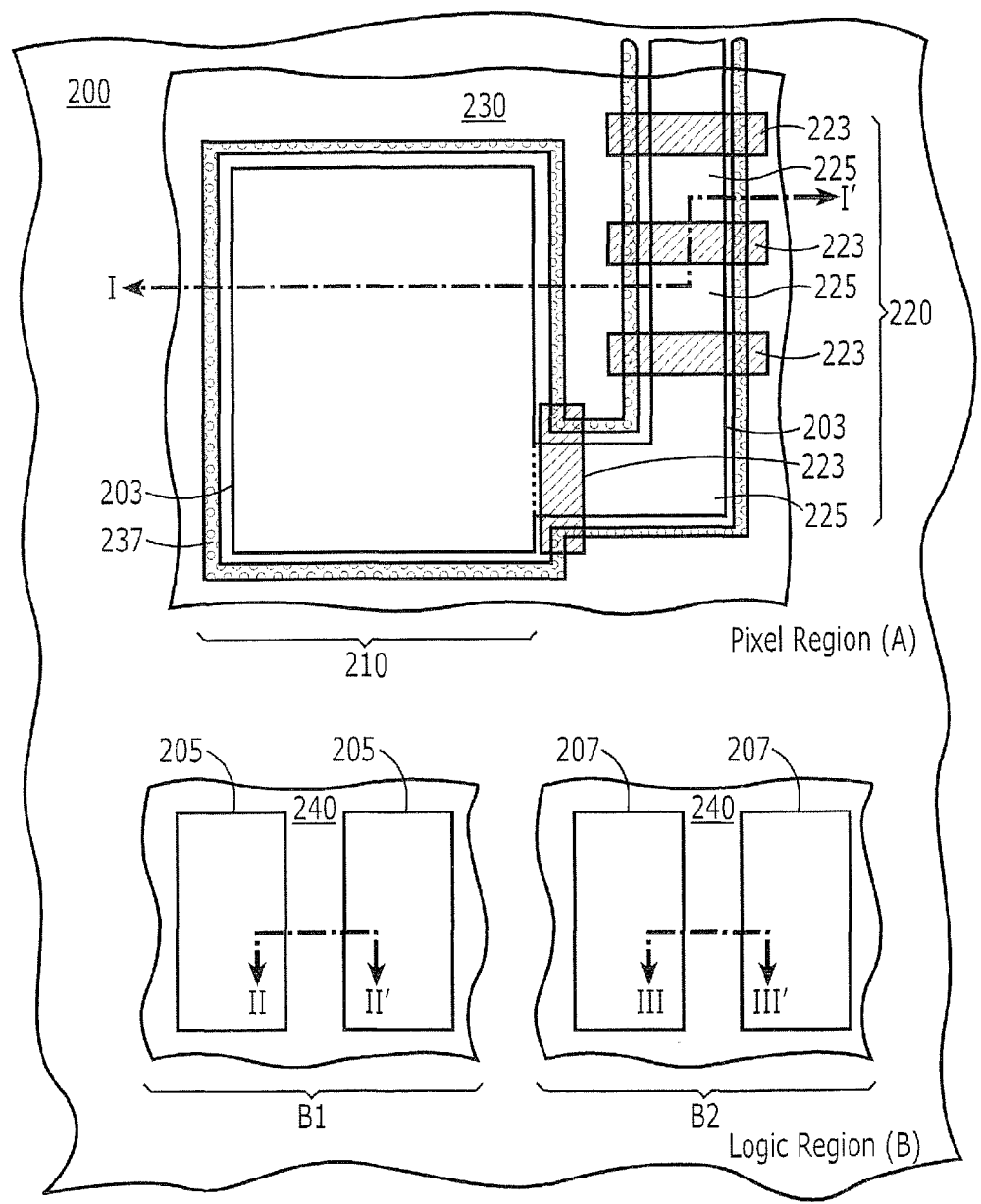
FIG. 3A is a top view of an image sensor according to other embodiments of the present invention.
Figure 3B:
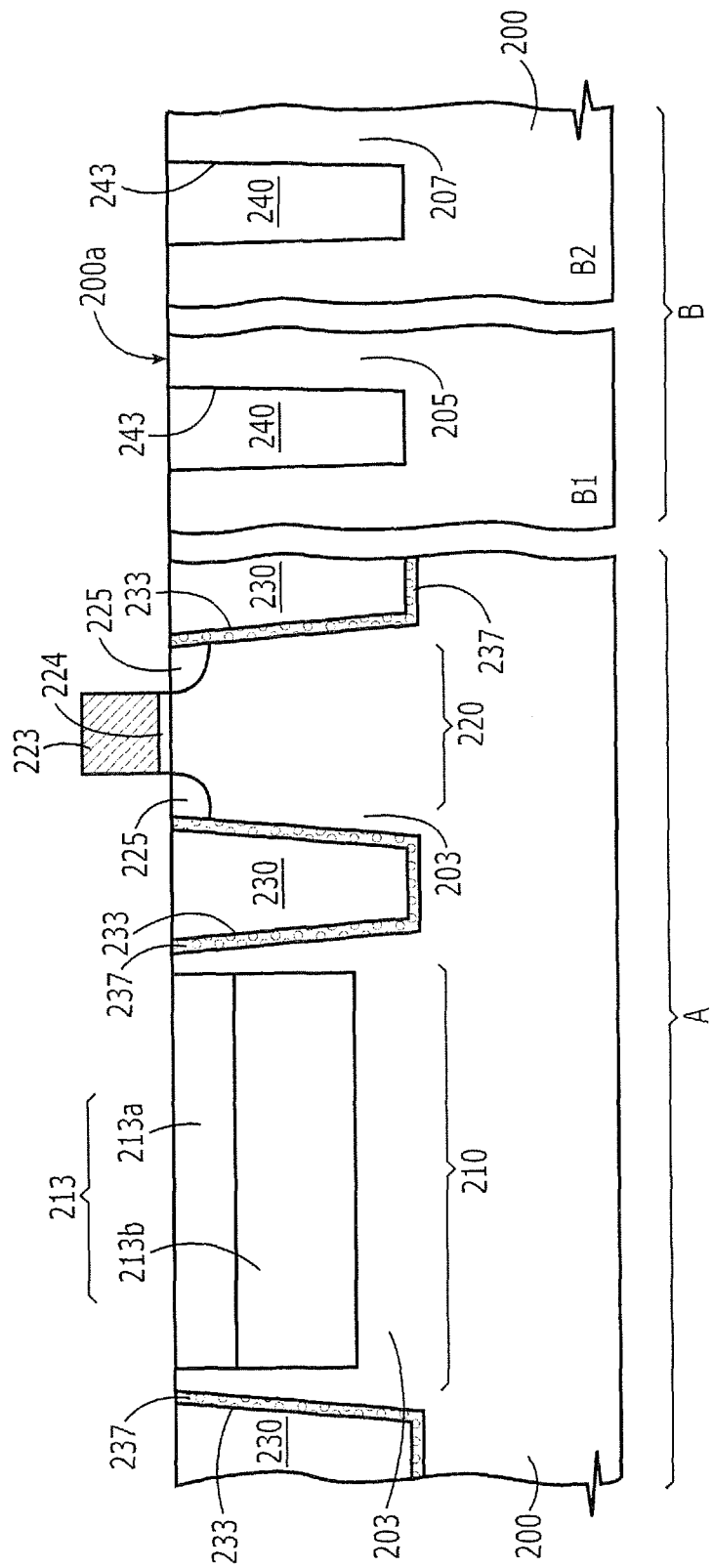
FIG. 3B is a cross-sectional view taken along the lines I-I', II-II' and III-III' of FIG. 3A.

FIG. 3A is a top view of image sensors according to other embodiments of the present invention, and FIG. 3B is a cross-sectional view of FIG. 3A, taken along lines I-I', II-II' and III-III'. Embodiments of FIGS. 3A and 3B may correspond to those of FIGS. 2A and 2B, except that an impurity layer 237 is also provided in the substrate 200 adjacent at least some of the pixel isolation region walls 233, wherein at least some of the logic isolation region walls 243 are free of the impurity layer 237. As shown in FIGS. 3A and 3B, in some embodiments, all of the logic isolation region walls 243, in both the NMOS region B1 and the PMOS region B2, are free of the impurity layer 237. In some embodiments, the impurity layer comprises P-type dopant, such as boron. Moreover, in other embodiments, the impurity layer 237 may be between about 20 nm and about 50 nm thick. As also shown, the impurity layer 237 may be spaced apart from the photoelectric conversion element 210 and, in some embodiments, may be spaced apart from the second region 213b of the photoelectric conversion element 210. In some embodiments, it may be desirable for the second region 213b to be spaced from the impurity layer 237, because electrons accumulate in the second region 213b in response to light.

As was described above, FIGS. 3A and 3B illustrate multiple slopes of isolation region walls (e.g., the pixel isolation region walls are less sloped than the logic isolation region walls) and a variable impurity layer (e.g., impurity layer adjacent the pixel isolation region walls, but not adjacent the logic isolation region walls), according to some embodiments of the present invention. Moreover, FIGS. 2A and 2B illustrate multiple slopes of isolation region walls without the variable impurity layer, according to other embodiments of the present invention. According to still other embodiments of the present invention, the variable impurity layer of FIGS. 3A and 3B may be provided without the multiple slopes of isolation region walls of FIGS. 3A-3B. Stated differently, in some embodiments, the impurity layer 237 may be provided in the pixel region A, but not in the logic region B, while all of the walls in the pixel and logic isolation regions may have about the same slope.

Figure 4A:
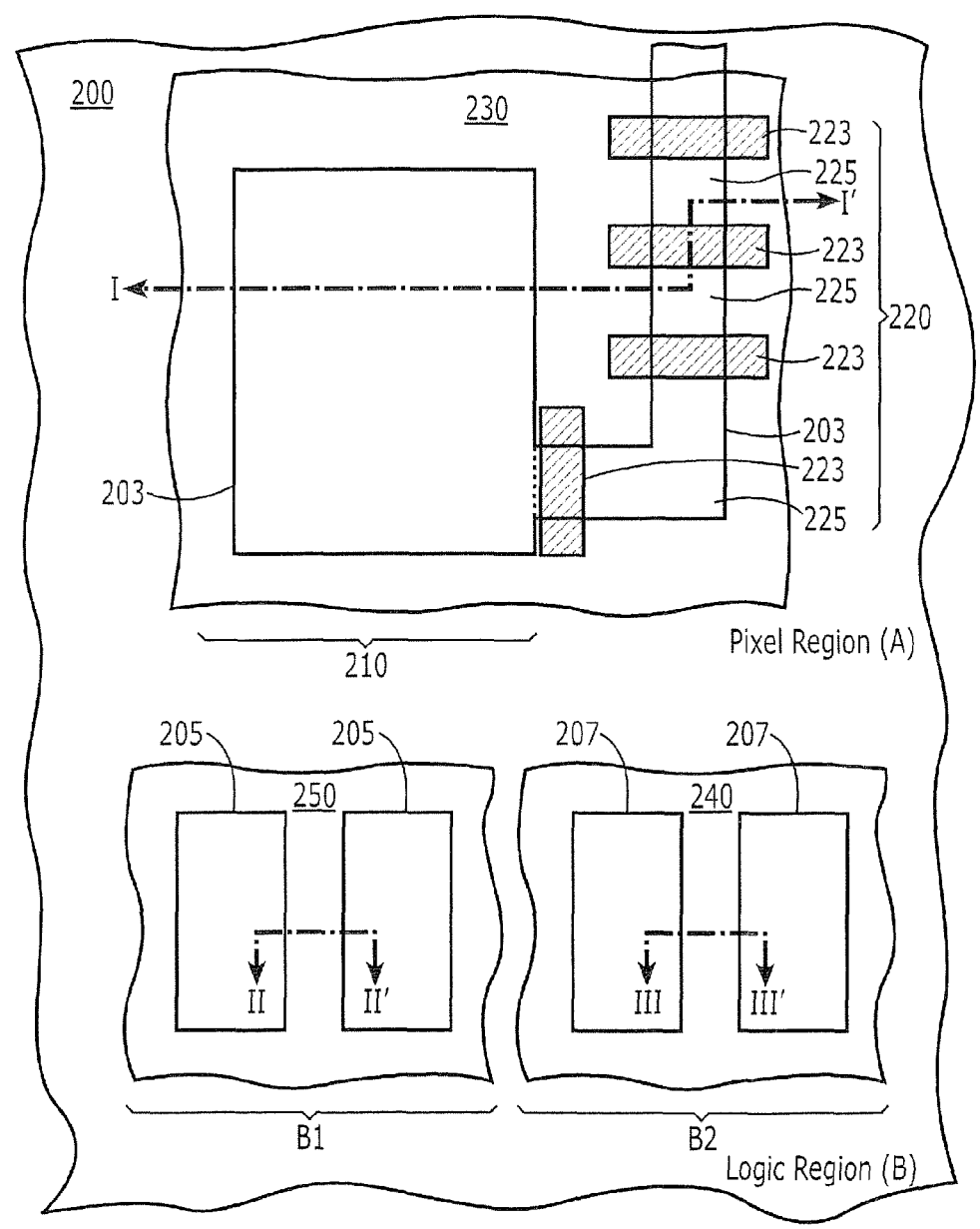
FIG. 4A is a top view of an image sensor according to still other embodiments of the present invention.
Figure 4B:
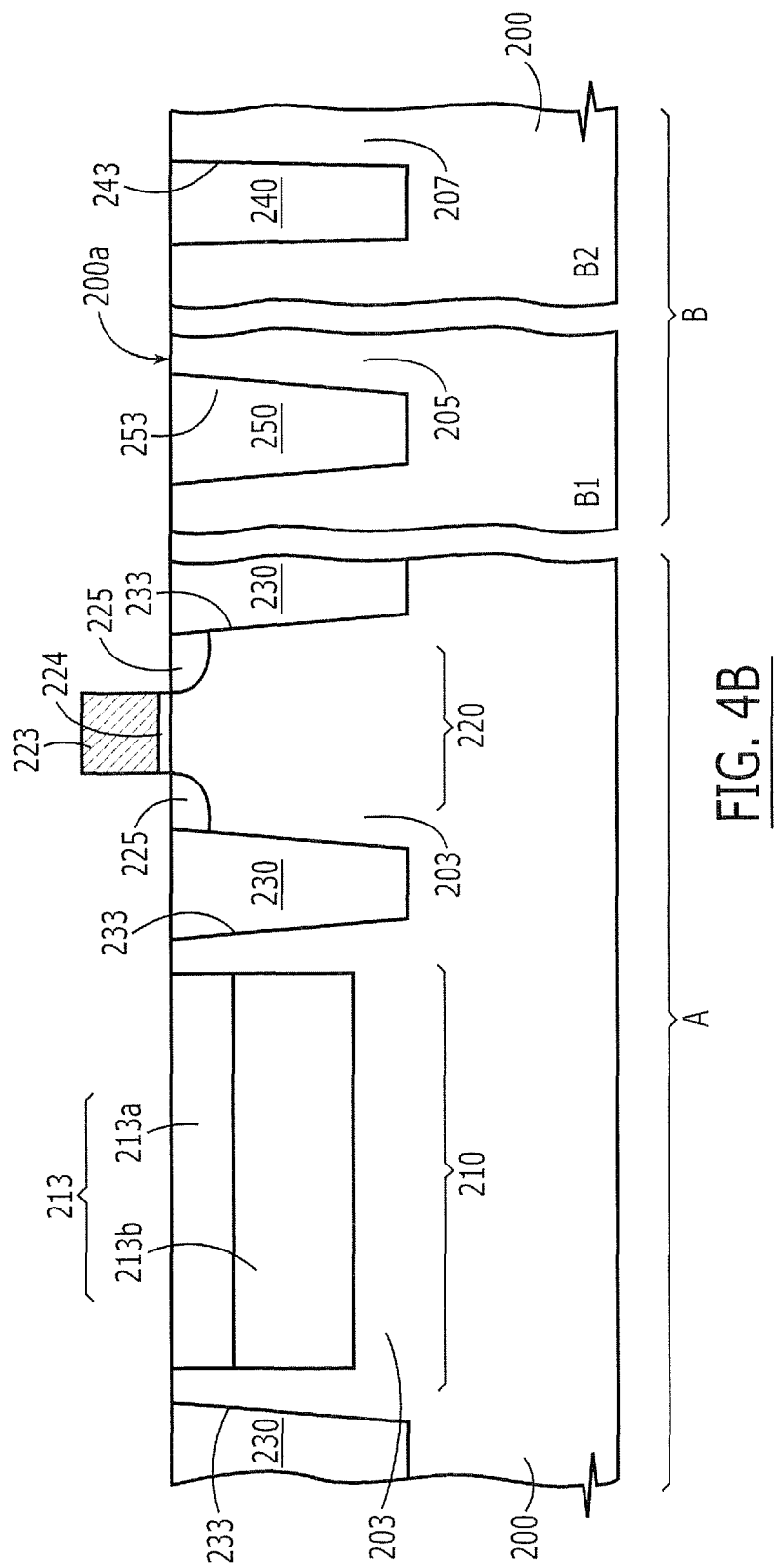
FIG. 4B is a cross-sectional view taken along the lines I-I', II-II' and III-III' of FIG. 4A.

FIGS. 4A and 4B are a top view and a cross-sectional view of image sensors according to still other embodiments of the present invention. Embodiments of FIGS. 4A and 4B may correspond to embodiments of FIGS. 2A and 2B, except that the pixel isolation regions 230 in the pixel region A include pixel isolation region walls 233 that are less sloped than the logic isolation region walls 243 of the isolation regions 240 that are adjacent the PMOS devices (region B2) and are of about the same slope as the logic isolation region walls 253 of the isolation regions 250 that are adjacent the NMOS devices (region B1). Stated differently, the trench isolation region walls in the PMOS region B2 are more orthogonal to the substrate face 200a than the trench isolation region walls in the NMOS region B1 or the pixel region A.

Figure 5A:
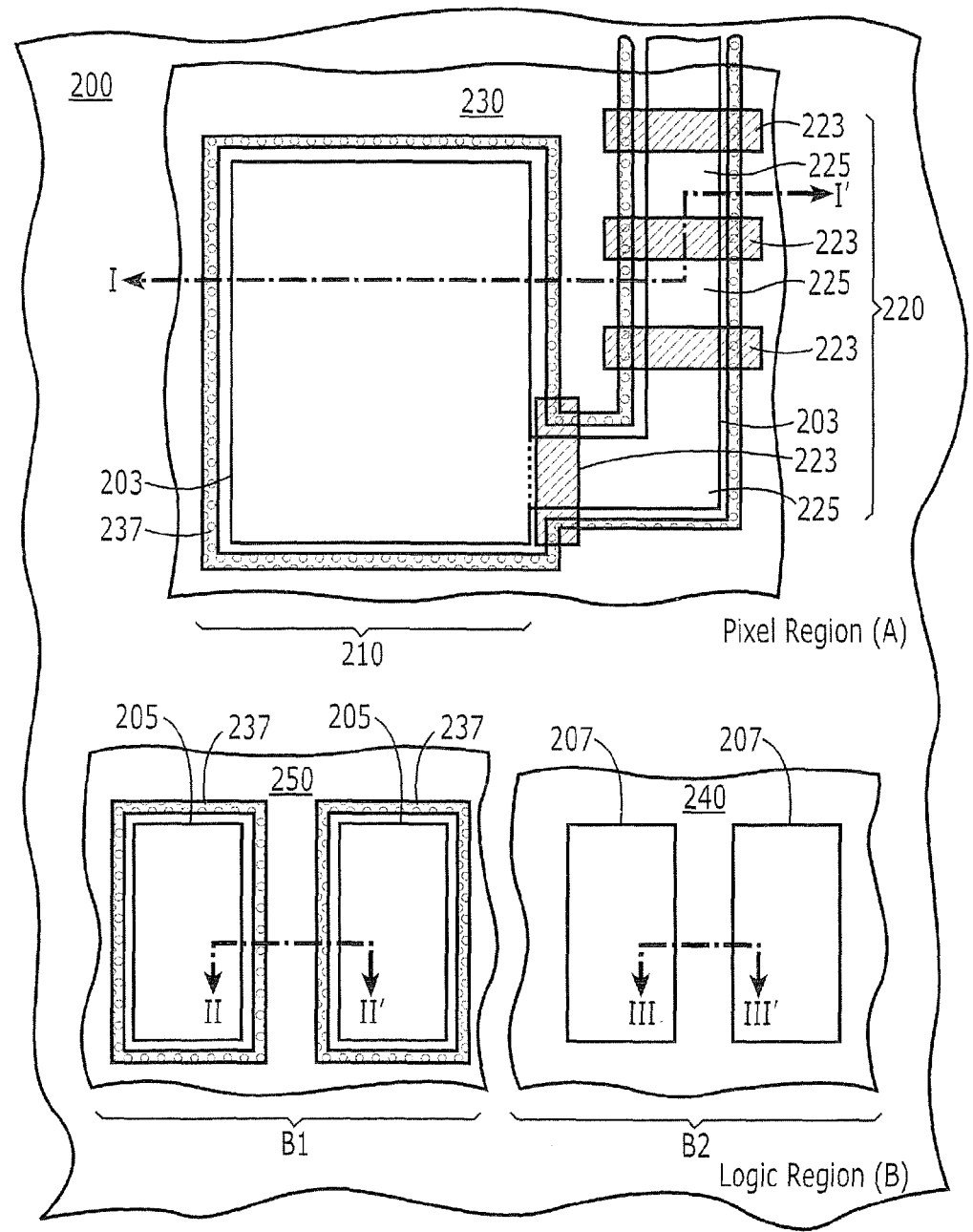
FIG. 5A is a top view of an image sensor according to yet other embodiments of the present invention.
Figure 5B:
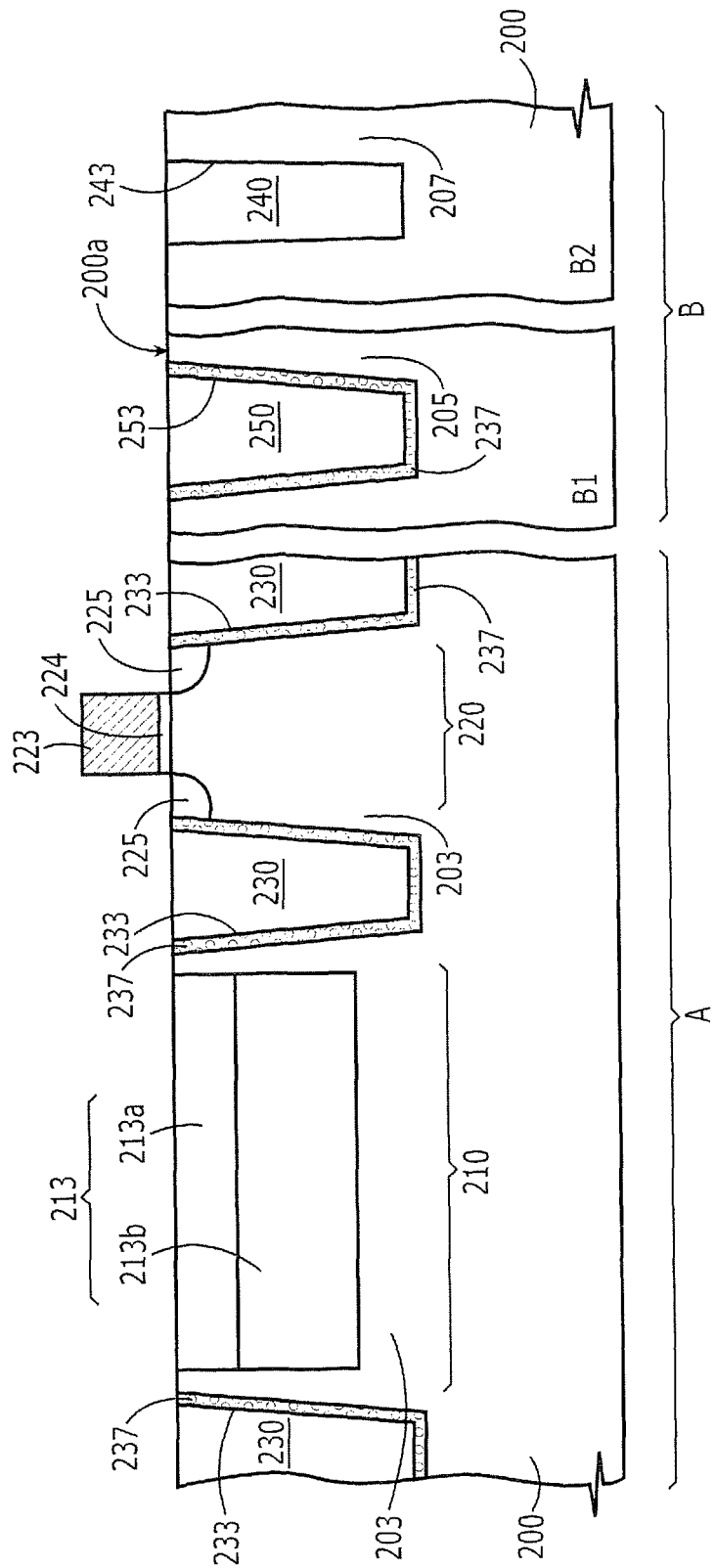
FIG. 5B is a cross-sectional view taken along the lines I-I', II-II' and III-III' of FIG. 5A.

FIGS. 5A and 5B correspond to FIGS. 3A and 3B, except that the impurity layer 237 is present in the NMOS region B1, but is not present in the PMOS region B2. Stated differently, the impurity layer 237 is adjacent at least some of the logic isolation region walls 253 that are adjacent the NMOS devices and is also adjacent the pixel isolation trench walls 233, but at least some of the logic isolation trench walls 243 that are adjacent the PMOS devices are free of the impurity layer 237. In other embodiments, all of the pixel isolation regions 230 and all of the logic isolation regions 250 that are adjacent the NMOS devices include the impurity layer 237 in the substrate 200 adjacent thereto, and all of the logic isolation regions 240 that are adjacent the PMOS devices are free of the impurity layer 237. The impurity layer may be a P-type dopant, such as boron, and may have dimensions as was described above. By providing an impurity layer adjacent the NMOS devices (region B1), leakage current ($I_{DOFF}$) may be reduced for these devices.

It will also be understood that FIGS. 4A and 4B illustrated multiple slope logic isolation regions relative to the NMOS and PMOS logic regions, and FIGS. 5A and 5B illustrated the combination of multiple slopes relative to the NMOS and PMOS logic regions, and a variable impurity layer relative to the NMOS and PMOS logic regions. In yet other embodiments of the present invention, the variable impurity layer may be provided relative to the NMOS and PMOS logic regions, without providing the multiple slopes. Stated differently, in these embodiments, the NMOS and PMOS isolation region walls may have same slope, but the NMOS region B1 may include the impurity layer 237, whereas the PMOS region B2 may be free of the impurity layer 237.

FIGS. 6A-6G are cross-sectional views of image sensors of FIGS. 3A and 3B during intermediate fabrication steps, illustrating methods of forming image sensors according to some embodiments of the present invention. Similar fabrication steps may be used to fabricate image sensors of FIGS. 2A and 2B. Moreover, embodiments of FIGS. 6A-6G may be used to fabricate integrated circuits other than image sensors, as well.

Figure 6A:
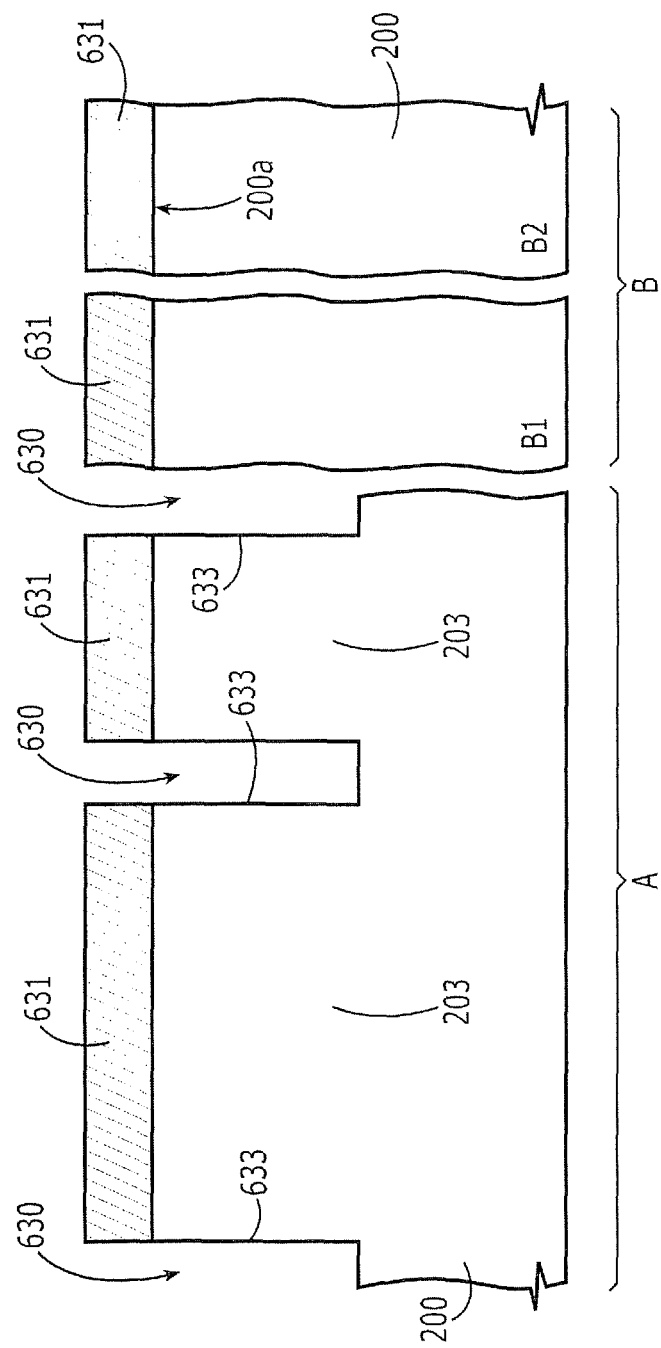
FIGS. 6A-6G are cross-sectional views of image sensors of FIGS. 3A and 3B during intermediate fabrication steps, illustrating methods of forming image sensors according to some embodiments of the present invention.

Referring now to FIG. 6A, a plurality of spaced apart isolation trenches 630, also referred to herein as first trenches 630, is etched in an integrated circuit substrate 200. As shown in FIG. 6A, the trenches include trench walls 633. As also shown in FIG. 6A, the first trenches 630 define the active regions 203 in the pixel region A. The first trenches 630 may be formed by forming a first mask pattern 631 on the substrate 200, and then anisotropically etching the substrate 200 to form the first trenches 630. The first mask pattern 631 may comprises silicon nitride, silicon oxynitride and/or other conventional mask layers. In forming the first trenches 630, the walls 633 thereof may include some damage, such as dangling bonds, stacking faults and/or other imperfections that may be caused by the anisotropic etch.

Figure 6B:
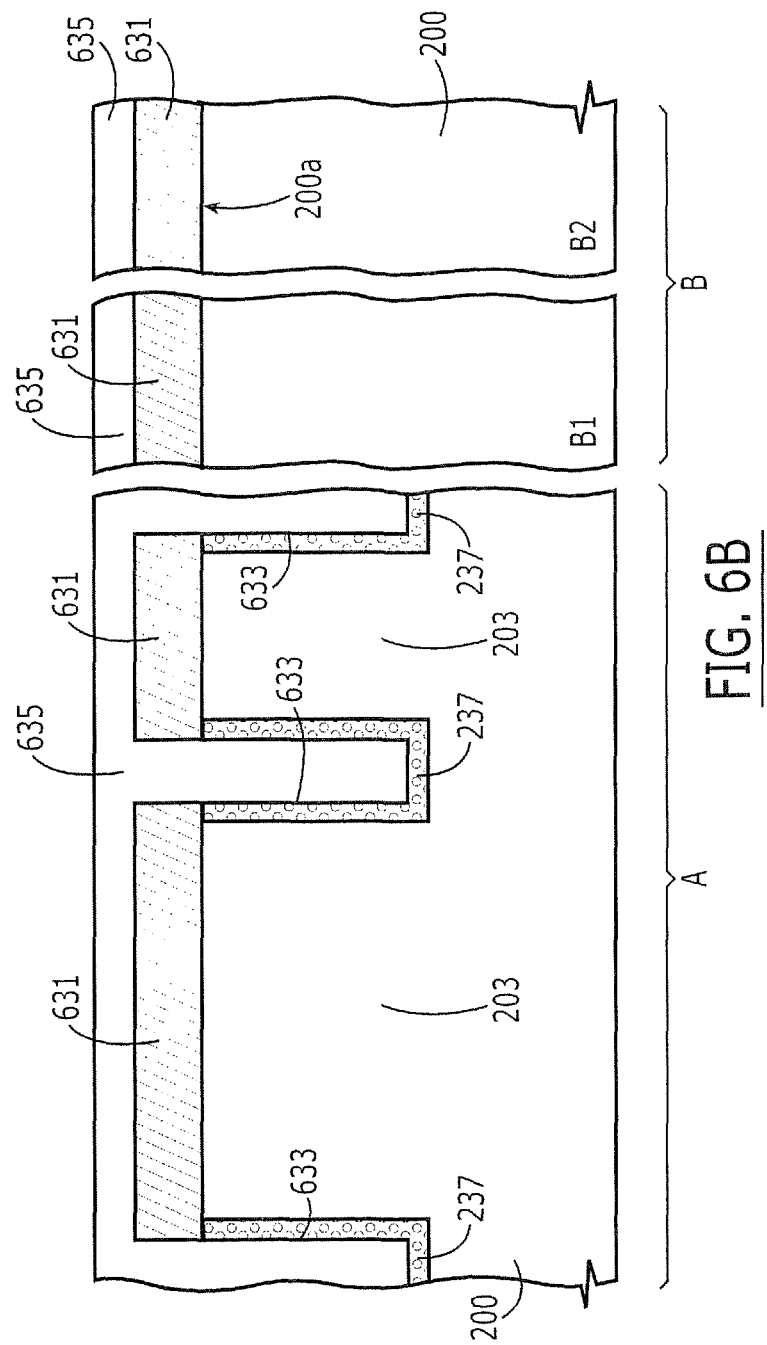

FIG. 6B illustrates the forming of a sacrificial layer 635 including an impurity therein, on at least some of the walls 633 of the first isolation trenches 630. FIG. 6B also illustrates diffusing at least some of the impurity from the sacrificial layer 635 into the trench walls 633 to form the impurity layer 237 in the substrate 200 adjacent the trench walls 633. More specifically, in some embodiments, the sacrificial layer 635 may comprise monocrystalline silicon germanium and/or polycrystalline silicon germanium that is doped with the impurity. This silicon germanium may be $Si_{1-x}Ge_x$, where $0.05<x<0.5$. The impurity may a P-type impurity, such as a boron, and may have a concentration of between about $10^{17}$ to about $10^{21}/cm^3$. In some embodiments, the impurity ions may be provided in situ with the sacrificial layer. The sacrificial layer 635 may be formed by epitaxial growth, for example using Vapor Phase Epitaxy (VPE) and/or Liquid Phase Epitaxy (LPE) using a silicon source of silane ($SiH_4$), disilane ($Si_2H_6$), dichlorosilane ($SiH_2Cl_2$) and/or other conventional silicon sources and a germanium source of germane ($GeH_4$) and/or other conventional germanium sources.

Figure 6C:
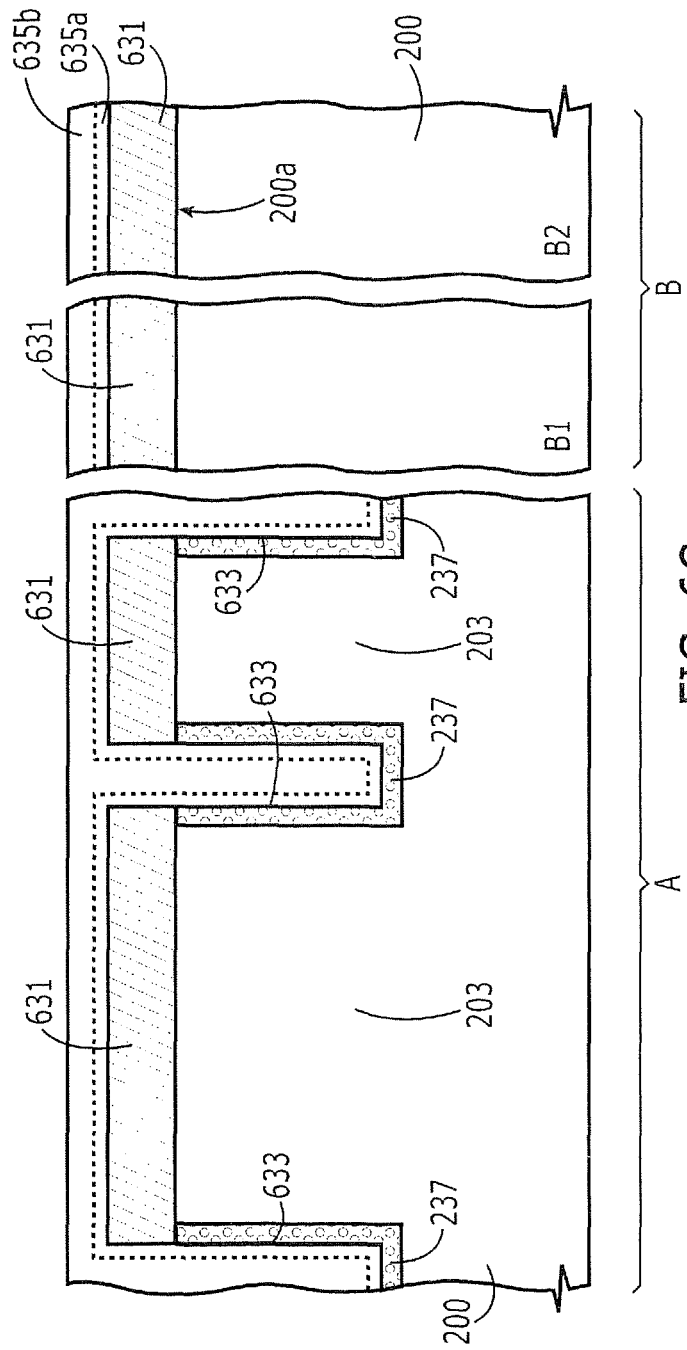

FIG. 6C illustrates other embodiments of the present invention wherein, rather than forming a single sacrificial layer 635, a thin sacrificial liner layer 635a is first formed, following by forming a sacrificial trench filling layer 635b on the sacrificial layer liner 635a. In some embodiments, the sacrificial layer liner 635a comprises monocrystalline silicon germanium and/or polycrystalline silicon germanium that is doped with the impurity. In other embodiments, the sacrificial liner layer 635a comprises monocrystalline silicon germanium that is doped with the impurity and the sacrificial trench filling layer 635b comprises polycrystalline silicon germanium that is doped with the impurity.

In particular, the sacrificial layer liner 635a may comprise a monocrystalline silicon germanium layer that can be grown epitaxially to have good surface characteristics with the trench walls 633. Since epitaxial growth of monocrystalline silicon germanium may be rather slow, only a thin liner layer, for example about 10 to 50 nm thick, may be formed using monocrystalline silicon germanium. Then, a thicker polycrystalline silicon germanium trench filling layer 635b may be deposited at a more rapid growth rate, to fill the trenches 630. In still other embodiments of the present invention, only the sacrificial liner layer 635a may be formed, and a sacrificial trench filling layer 635b need not be formed, as long as the sacrificial liner layer 635a may contain sufficient impurities to diffuse into the substrate 200 and form the impurity layer 237 at a desired thickness/concentration.

Accordingly, some embodiments of the present invention may provide a sacrificial layer liner, such as a monocrystalline silicon germanium liner layer that is doped with the impurity. Other embodiments may provide a sacrificial trench filling layer, such as a monocrystalline silicon germanium trench filling layer or a polysilicon germanium trench filling layer that is doped with the impurity. Yet other embodiments of the present invention may provide a combination of a sacrificial layer liner and a sacrificial trench filling layer, wherein the sacrificial layer liner is formed of, for example, monocrystalline silicon germanium and the sacrificial trench filling layer is formed of, for example, polycrystalline silicon germanium.

Referring again to FIGS. 6B and 6C, the impurity ions from the sacrificial layer 635, the sacrificial layer liner 635a and/or the sacrificial trench filling layer 635b diffuse into the substrate 200 to form the impurity layer 237. Diffusion may take place by heating the substrate 200, for example by rapid thermal annealing at between about 800° C. and about 1050° C. The temperature and/or process time may be adjusted based on a desired diffusion length of ions and/or other conditions. In some embodiments, the impurity layer 237 may be between about 20 nm and about 50 nm thick.

Figure 6D:
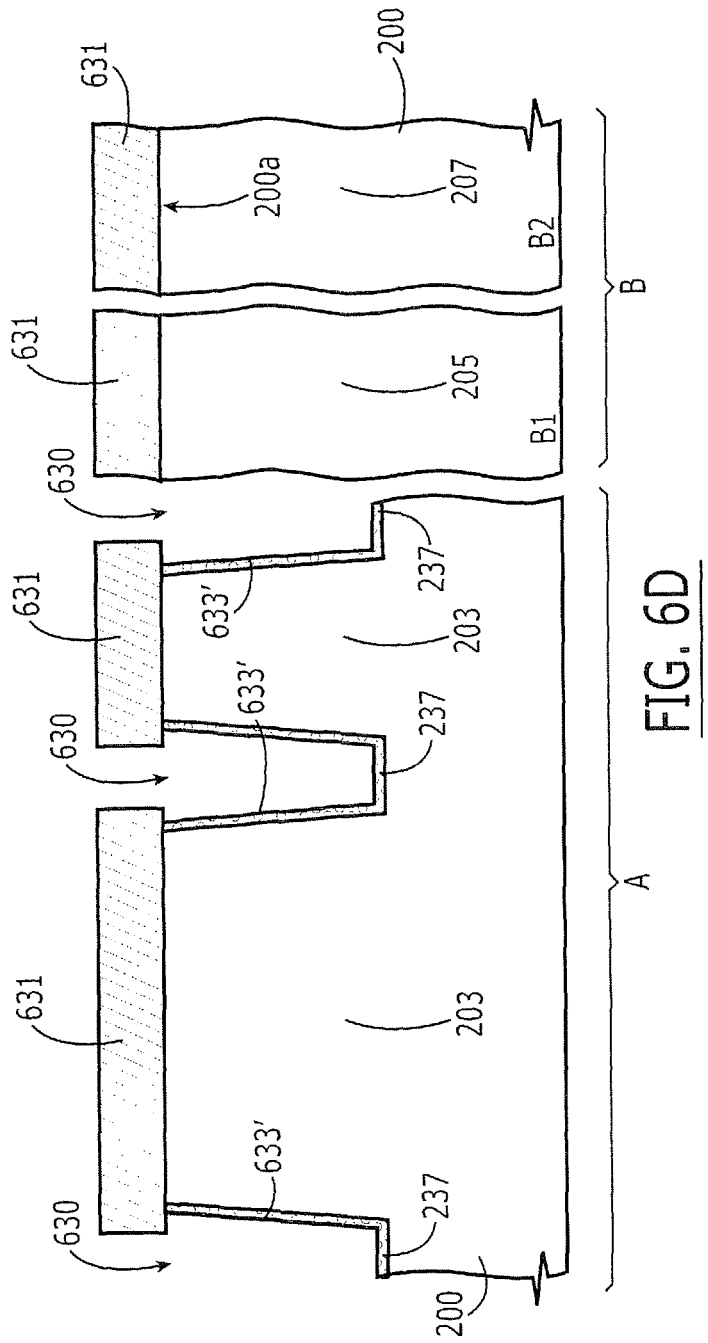

Referring now to FIG. 6D, at least some of the sacrificial layer 635/635a/635b is removed. FIG. 6D illustrates removing all of the sacrificial layer, including the sacrificial layer 635 of FIG. 6B or the sacrificial layer liner 635a and the sacrificial trench filling layer 635b of FIG. 6C.

Still referring to FIG. 6D, the sacrificial layer may be removed by performing a wet etch, when the sacrificial layer comprises silicon germanium. The wet etch solution may be a well known RCA cleaning solution that may include ammonia, hydrogen peroxide, nitric acid and hydrofluoric acid. However, other wet etching solutions may also be used. Temperatures of between about 40° C. and about 90° C. may be used, and a wet etching selectivity of between about 50:1 and about 100:1 of silicon germanium:silicon may be provided in some embodiments. As also shown in FIG. 6D, the wet etch may etch more of the opening of trench 233 than the trench floor, so that trench walls 633' of FIG. 6D may have less slope than the trench walls 633 of FIGS. 6A-6C. Stated differently, the trench walls 633 of FIGS. 6A-6C, that were formed by an anisotropic (dry) etch may be almost orthogonal, whereas the trench walls 633' of FIG. 6D may be more oblique. Even more specifically, the trench walls 633 may be sloped at between about 83° and about 90° from the face 200a of the substrate 200 prior to the etching of FIG. 6D, and the trench walls 633' may be sloped at between about 70° and about 80° from the face 200a of the substrate 200 after the etching of FIG. 6D.

Figure 6E:
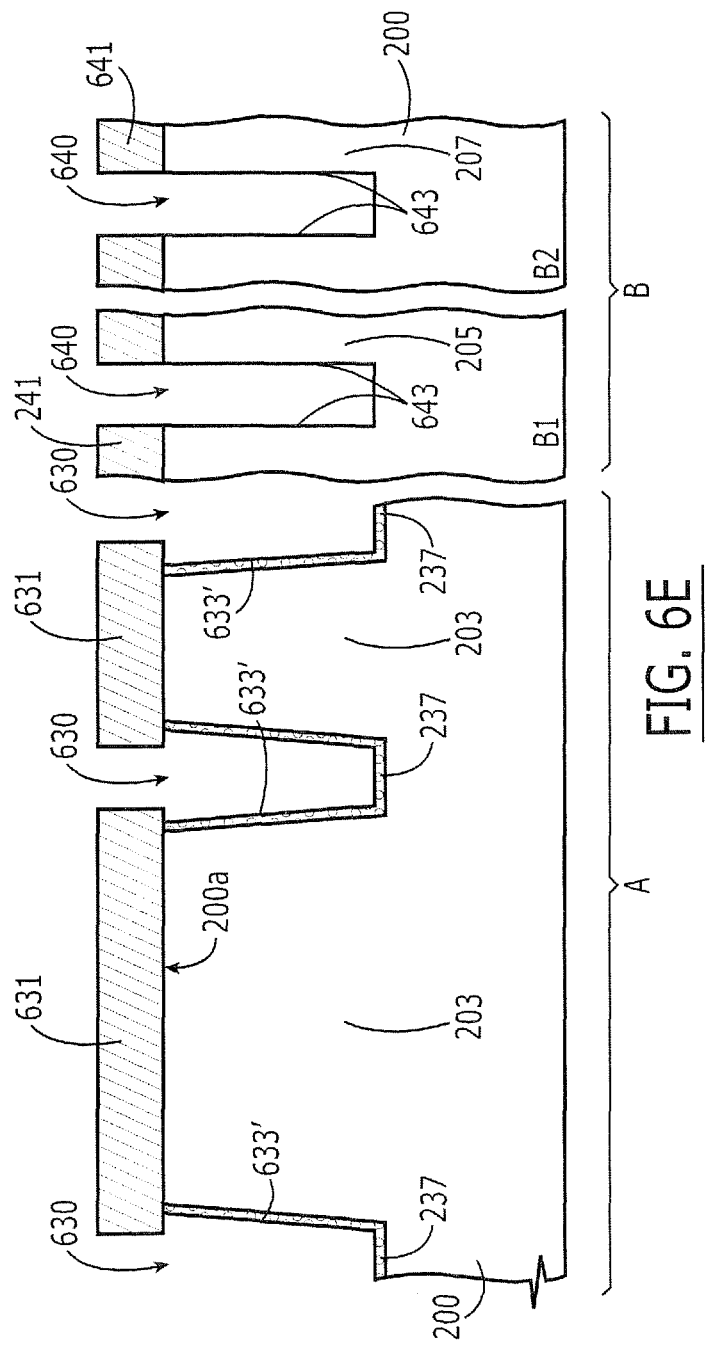

Referring now to FIG. 6E, second trenches 640 are formed to define active regions 205/207 in the logic region B. These second trenches 640 may be formed by forming a second mask pattern 641 on the substrate 200 and anisotropically etching the substrate 200 to form the second trenches 640. The walls 643 of the second trenches 640 may have some damaged layers, such as dangling bonds and/or stacking faults that are caused by the anisotropic etch. Moreover, the first trenches 630 of FIG. 6E have less slope than the second trenches 640 of FIG. 6E.

Figure 6F:
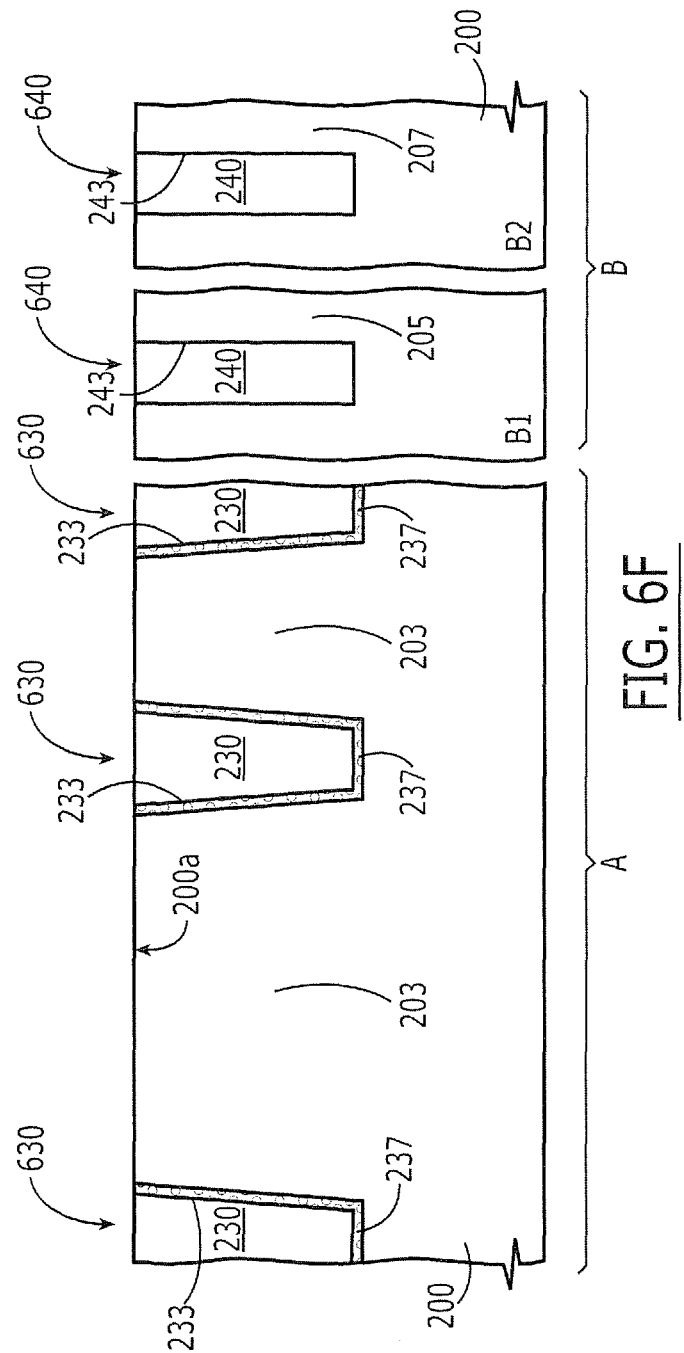

Referring now to FIG. 6F, a first isolation region 230 and a second isolation region 240 may be formed in the respective first and second trenches 630, 640. In some embodiments, the first and second isolation regions 230/240 fill the respective first and second trenches 630/640. In some embodiments, the first and second isolation regions 230/240 may be fabricated by blanket forming an insulation material on the substrate 200 and then planarizing the substrate to reveal the second mask pattern 641. The second mask pattern 641 may then be removed. The insulation material may be silicon dioxide, and may be fabricated using chemical vapor deposition and/or high density plasma. In other embodiments, multiple insulating layers may be formed including a liner layer and a trench filling insulating layer. For example, a thermal oxide liner layer followed by a trench filling insulating layer using chemical vapor deposition may be formed to reduce dark current in the image sensor. Many other embodiments of insulating layer(s) may be used to form shallow trench isolation regions.

Figure 6G:
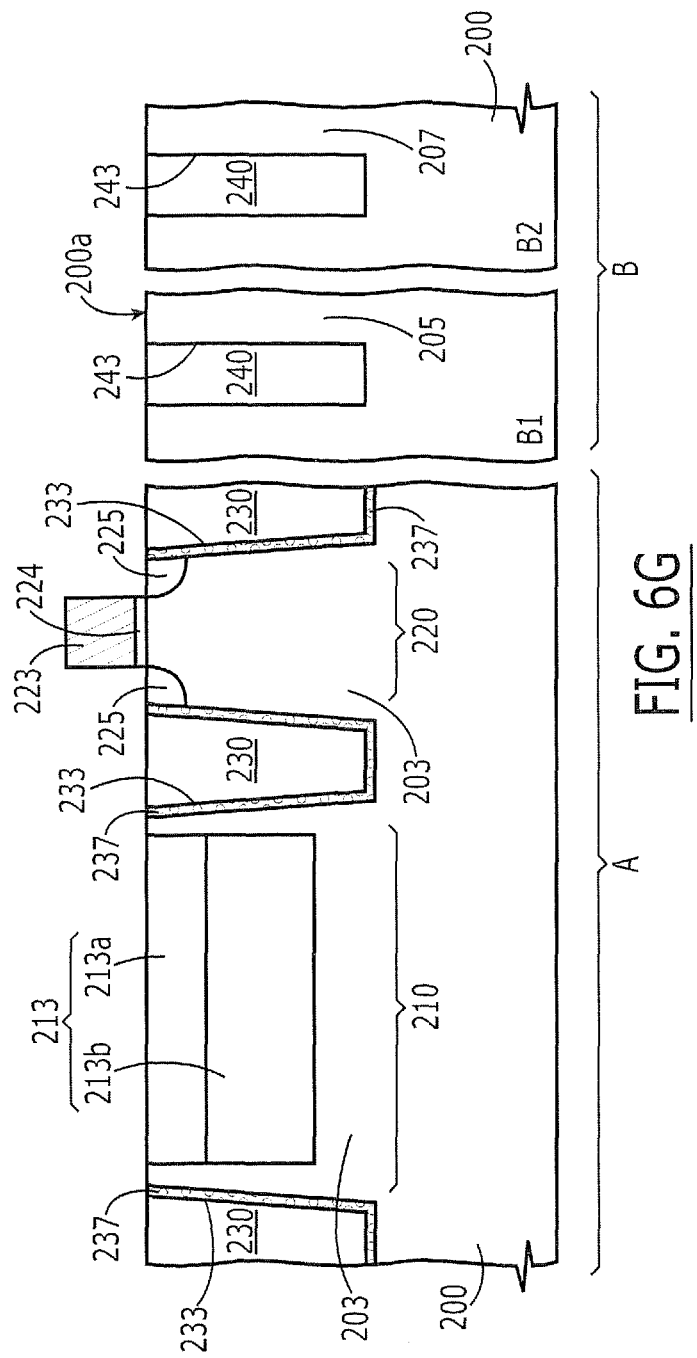

Finally, referring to FIG. 6G, a transistor structure is formed on the substrate 200. In particular, a gate insulation layer 224, a gate electrode 223 and a drain region 225 may be formed using conventional techniques. The transistor structure may include transfer, reset, driver and select transistors in the pixel region A. A photodiode 213 also may be formed in the substrate by forming a first photodiode region 213a, comprising P-type impurities and a second photodiode region 213b, including N-type impurities. The order of fabrication of the photodiode and/or transistor elements of FIG. 6G may be different from that described above.

FIGS. 7A-7F are cross-sectional views of methods of fabricating structures of FIGS. 5A and 5B, according to various embodiments of the present invention. Moreover, structures of FIGS. 4A and 4B may be fabricated similarly. In FIGS. 7A-7F, the operations that are similar to those of FIGS. 6A-6G will not be described again for the sake of brevity. Rather, the differences will be emphasized.

Figure 7A:
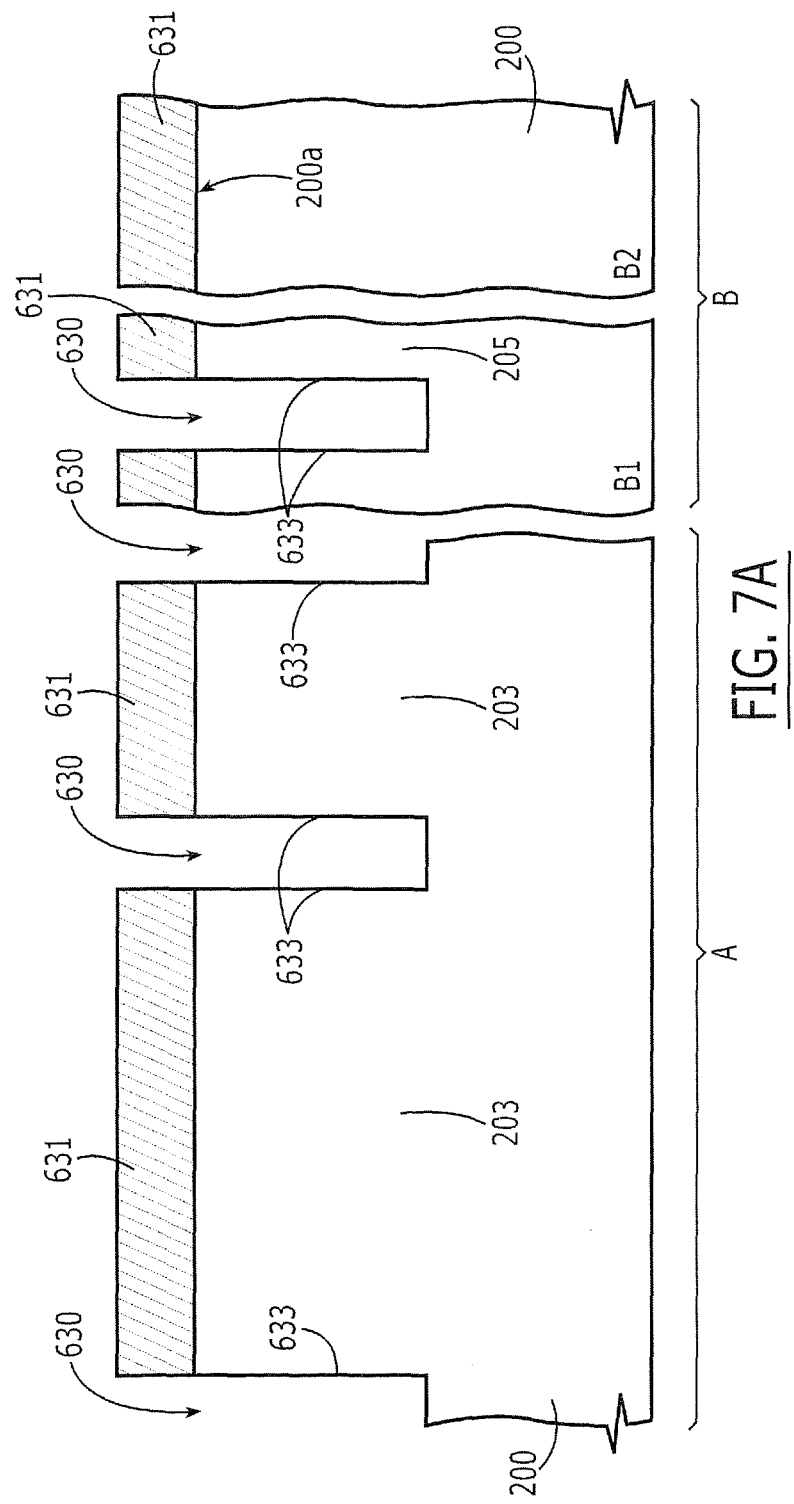
FIGS. 7A-7F are cross-sectional views of image sensors of FIGS. 5A and 5B during intermediate fabrication steps, illustrating methods of forming image sensors according to other embodiments of the present invention.
Figure 7B:
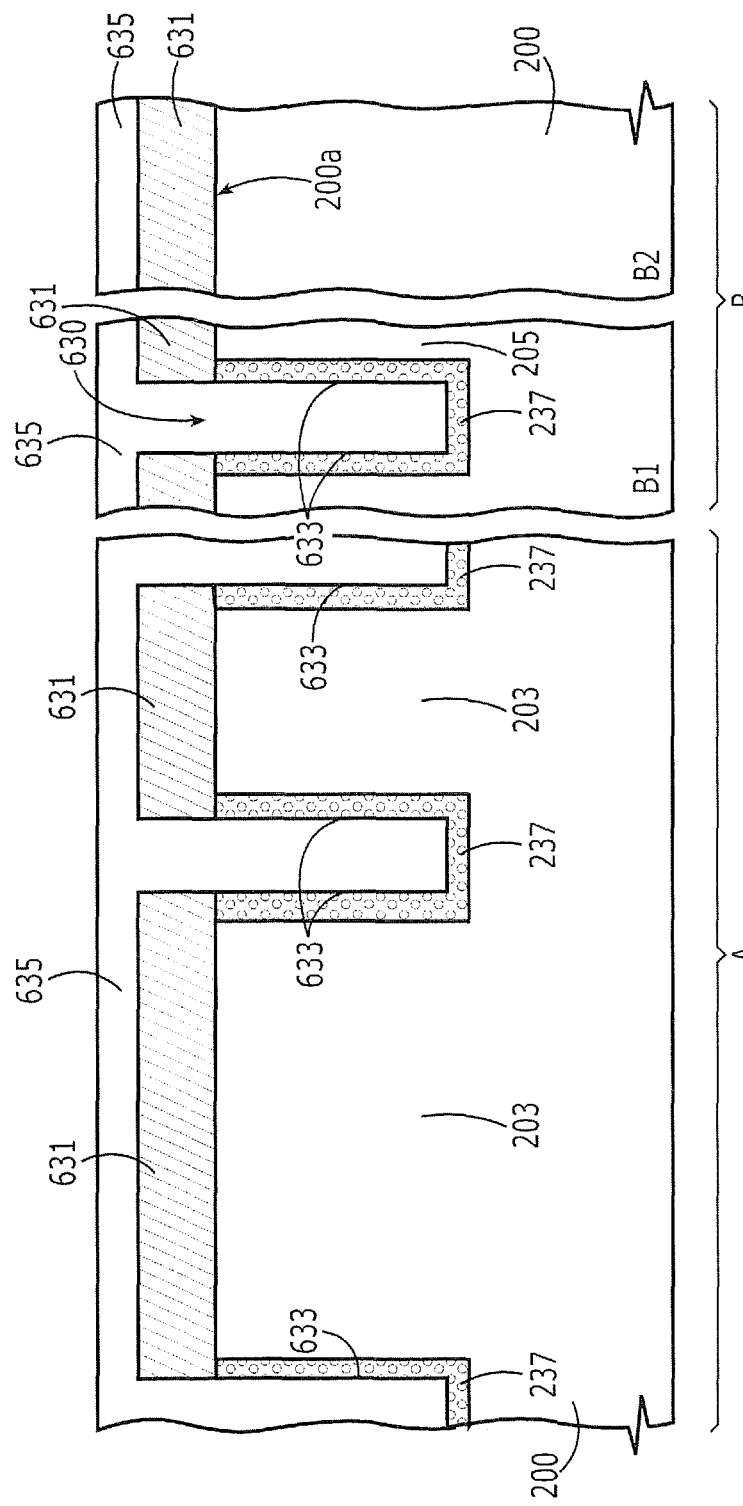

In particular, referring to FIG. 7A, the first trenches 630 are formed. However, in embodiments of FIGS. 7A-7F, the first trenches 630 are formed in the NMOS region B1, in addition to in the pixel region A, as shown. In FIG. 7B, one or more sacrificial layers 635 is formed in the pixel region A and in the NMOS region B1. The sacrificial layer(s) 635 may be fabricated as was described in connection with FIGS. 6B and/or 6C. Diffusion then takes place to form the impurity layer 237, as was also described in connection with FIGS. 6B and 6C.

Figure 7C:
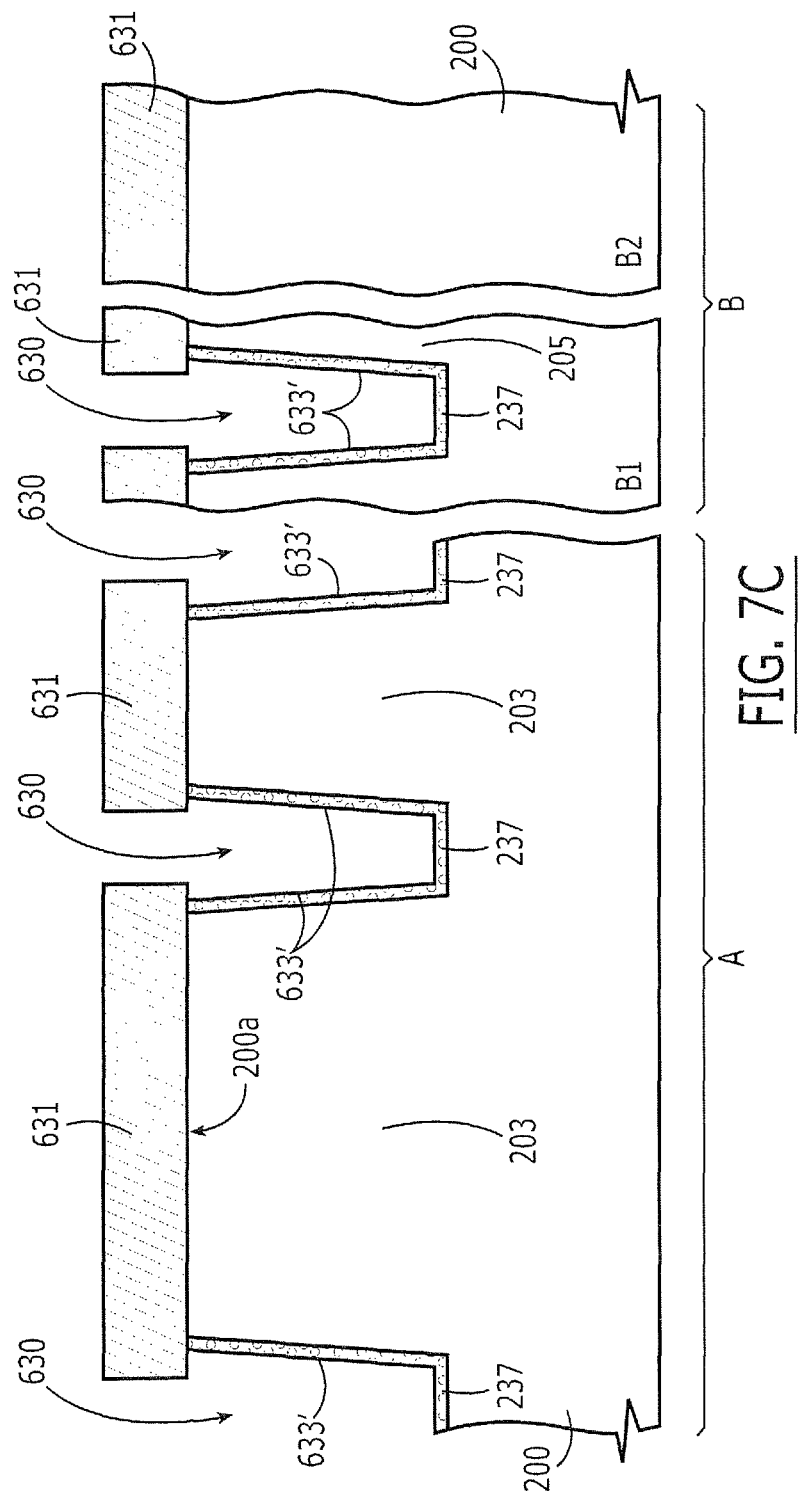
Figure 7D:
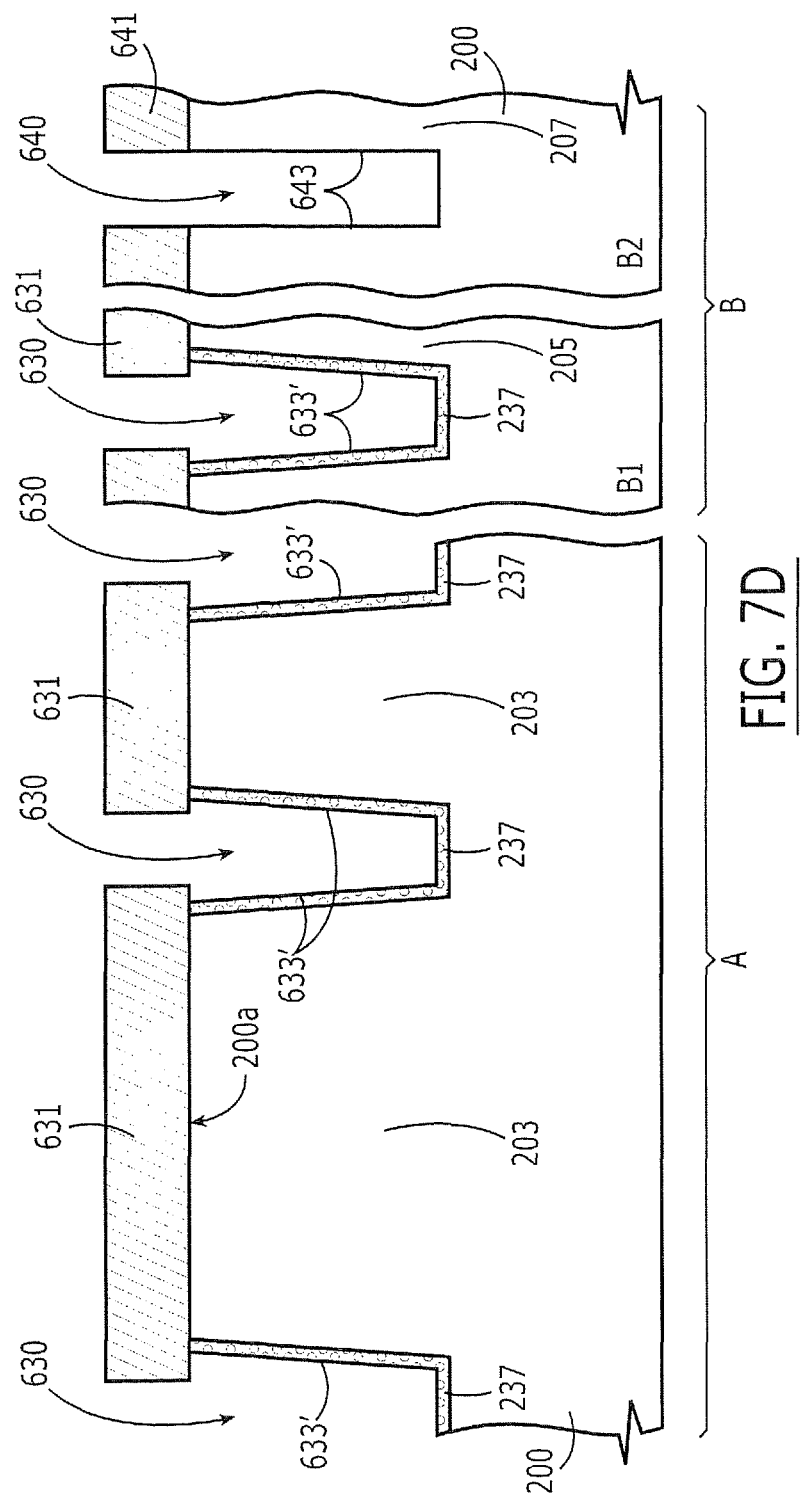

Then, referring to FIG. 7C, wet etching takes place as was described in connection with FIG. 6D, except that wet etching of the NMOS region B1 also takes place. Second trenches 640 are then formed in FIG. 7D, similar to FIG. 6E, except that the second trenches 640 are only formed in the PMOS region B2 and not in the NMOS region B1.

Figure 7E:
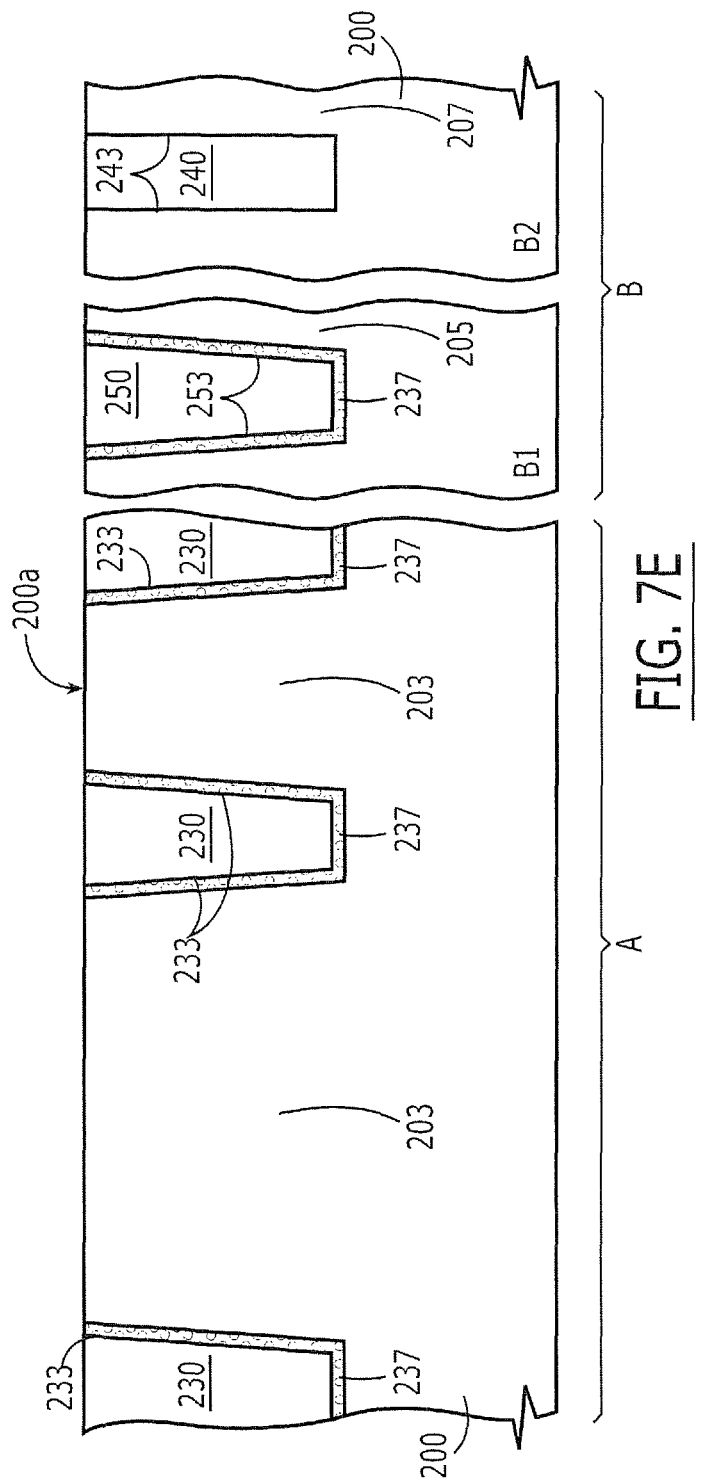
Figure 7F:
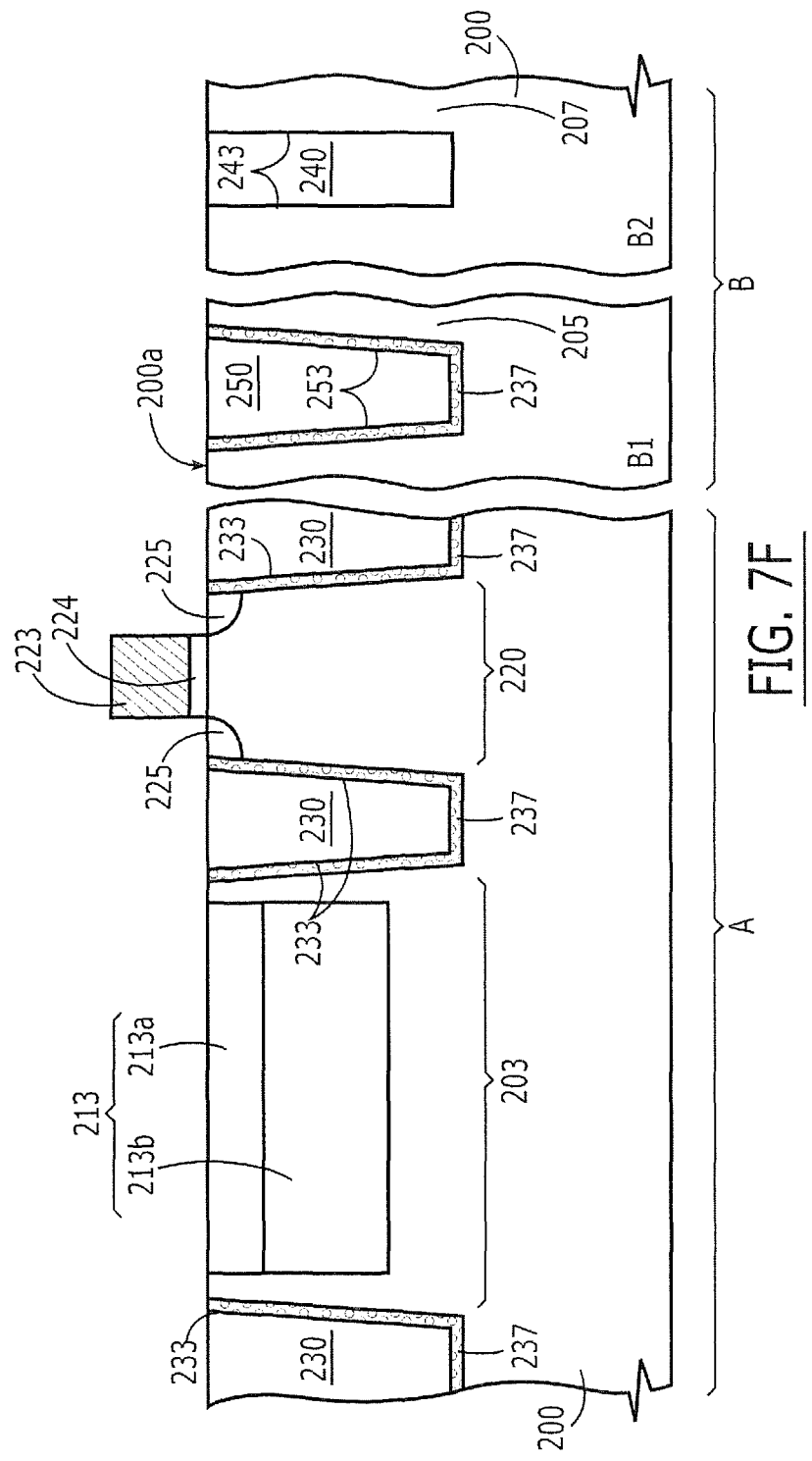

Referring now to FIG. 7E, the trenches are filled as was described in connection with FIG. 6F. The transistors and photodiodes are then formed in FIG. 7F, as was described in connection with FIG. 6G.

Embodiments of the present invention have been illustrated with pixel isolation regions and logic isolation regions that are all of about the same depth. However, in other embodiments of the present invention, the pixel isolation regions may be deeper than the logic isolation regions. The logic isolation regions (PMOS and NMOS) may all be of about the same depth. Other depth variation also may be provided.

As was described above, some embodiments of the present invention can provide an impurity layer in the substrate that is adjacent at least some of the pixel isolation region walls, which can reduce undesirable dark current. The pixel isolation region walls may also be less sloped than the logic isolation region walls, so as to reduce the likelihood of the impurity layer or the trench isolation region touching or otherwise impacting the N photodiode region where electrons accumulate as a result of optical sensing. Again, dark current may be reduced. Moreover, in other embodiments, the impurity layer may be provided for the NMOS device isolation regions in the logic region and the less sloped sidewalls also may be provided for the NMOS device isolation regions in the logic region, to further reduce the leakage current and/or improve the performance thereof. Improved image sensors and fabrication methods may thereby be provided.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating an integrated circuit comprising:
providing an integrated circuit substrate including a pixel region and a logic region;
etching a plurality of spaced apart isolation trenches in the integrated circuit substrate of the pixel region, the trenches including trench walls;
forming a sacrificial layer including an impurity therein on at least some of the trench walls;
diffusing at least some of the impurity from the sacrificial layer into the trench walls to form an impurity layer in the substrate adjacent the trench walls;
removing at least some of the sacrificial layer; and
etching the integrated circuit substrate of the logic region to form a plurality of logic isolation trenches, the logic isolation trenches including logic trench walls;
wherein at least some of the trench walls in the logic region are free of the impurity layer.

2. A method according to claim 1 further comprising:
forming a plurality of photoelectric conversion elements in the substrate, such that the photoelectric elements are adjacent the impurity layer and the impurity layer reduces dark current in the photoelectric conversion elements compared to absence of the impurity layer.

3. A method according to claim 2 wherein forming a sacrificial layer comprises forming a sacrificial layer liner in the isolation trenches.

4. A method according to claim 3 wherein forming a sacrificial layer liner is followed by forming a sacrificial trench filling layer on the sacrificial layer liner.

5. A method according to claim 4 wherein the sacrificial layer liner comprises monocrystalline silicon germanium that is doped with the impurity and wherein the sacrificial trench filling layer comprises polycrystalline silicon germanium that is doped with the impurity.

6. A method according to claim 3 wherein the sacrificial layer liner comprises monocrystalline silicon germanium and/or polycrystalline silicon germanium that is doped with the impurity.

7. A method according to claim 2 wherein forming a plurality of photoelectric conversion elements in the substrate, adjacent the impurity layer, comprises:
forming a plurality of first regions of first conductivity type in the substrate; and
forming a plurality of second regions of second conductivity type beneath the first regions such that the second regions are spaced apart from the impurity layer.

8. A method according to claim 1 wherein the sacrificial layer comprises monocrystalline silicon germanium and/or polycrystalline silicon germanium that is doped with the impurity.

9. A method according to claim 1 wherein removing at least some of the sacrificial layer comprises etching the sacrificial layer and at least some of the trench walls to decrease a slope of the trench walls.

10. A method according to claim 9 wherein the trench walls are sloped at between about 83° and about 90° from a face of the substrate prior to the etching and wherein the trench walls are sloped at between about 70° and about 80° from the face of the substrate after the etching.

11. A method according to claim 9 wherein the trench walls are substantially orthogonal to a face of the substrate prior to the etching and wherein the trench walls are oblique to the face of the substrate after the etching.

12. A method according to claim 1 wherein diffusing at least some of the impurity from the sacrificial layer into the trench walls comprises rapid thermal annealing.

13. A method according to claim 1 wherein the impurity layer is between about 20 nm and about 50 nm thick.

14. A method according to claim 1 further comprising forming an insulating layer in the trenches from which the sacrificial layer has been at least partially removed.

15. A method according to claim 1 further comprising filling the trenches from which the sacrificial layer has been at least partially removed with insulating material to form isolation regions.

16. A method according to claim 1 wherein forming a sacrificial layer comprises selectively forming a sacrificial layer on some of the trench walls such that others of the trench walls are free of the sacrificial layer thereon.

17. A method according to claim 1 wherein the integrated circuit substrate is an image sensor integrated circuit substrate including the pixel region and the logic region, and wherein forming a sacrificial layer comprises selectively forming a sacrificial layer on at least some of the trench walls in the pixel region such that at least some of the trench walls in the logic region are free of the sacrificial layer thereon, the method further comprising:
forming a plurality of photoelectric conversion elements in the pixel region; and
forming a plurality of logic circuits in the logic region.

18. A method according to claim 17 wherein the logic region comprises an NMOS device region and a PMOS device region, wherein forming a sacrificial layer comprises selectively forming a sacrificial layer on at least some of the trench walls in the pixel region and at least some of the trench walls in the NMOS device region such that at least some of the trench walls in the PMOS device region are free of the sacrificial layer thereon, and wherein forming a plurality of logic circuits in the logic region comprises forming a plurality of NMOS devices in the NMOS device region and forming a plurality of PMOS devices in the PMOS device region.

19. A method according to claim 1 wherein the impurity comprises P-type dopant.

20. A method according to claim 19 wherein the P-type dopant comprises boron.

21. A method according to claim 1 wherein forming a plurality of photoelectric conversion elements in the substrate, adjacent the impurity layer, comprises forming a plurality of photoelectric conversion elements in the substrate, spaced apart from the impurity layer.

* * * * *